(12) United States Patent
Uenaka et al.

(10) Patent No.: US 8,581,323 B2
(45) Date of Patent: Nov. 12, 2013

(54) NONVOLATILE SEMICONDUCTOR MEMORY DEVICE AND METHOD OF MANUFACTURING SAME

(75) Inventors: Tsuneo Uenaka, Yokkaichi (JP); Kazuyuki Higashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 892 days.

(21) Appl. No.: 12/727,708

(22) Filed: Mar. 19, 2010

(65) Prior Publication Data

US 2011/0169071 A1 Jul. 14, 2011

(30) Foreign Application Priority Data

Jan. 8, 2010 (JP) ................................ P2010-3307

(51) Int. Cl.
*H01L 29/76* (2006.01)
*H01L 29/792* (2006.01)
(52) U.S. Cl.
USPC .......................................... 257/316; 257/324
(58) Field of Classification Search
USPC .................. 257/E21.677, E21.679, E27.103, 257/E29.103, E29.17, E29.309, 314–326, 257/E21.662–E21.678; 438/216, 261, 591, 438/593
See application file for complete search history.

(56) References Cited

U.S. PATENT DOCUMENTS

| | | | |
|---|---|---|---|
| 7,381,640 B2 | 6/2008 | Lee | |
| 7,539,056 B2 | 5/2009 | Katsumata et al. | |
| 8,278,695 B2 * | 10/2012 | Kidoh et al. | 257/314 |
| 8,314,455 B2 * | 11/2012 | Shiino et al. | 257/324 |
| 2007/0252201 A1 | 11/2007 | Kito et al. | |
| 2009/0140234 A1 | 6/2009 | Moniwa et al. | |

FOREIGN PATENT DOCUMENTS

| | | |
|---|---|---|
| EP | 1 577 938 A1 | 9/2005 |
| JP | 2007-266143 | 10/2007 |
| JP | 2008-166326 | 7/2008 |
| JP | 2008-258458 | 10/2008 |
| JP | 2009-224612 | 10/2009 |

OTHER PUBLICATIONS

U.S. Appl. No. 13/603,616, filed Sep. 5, 2012, Yahashi.
Office Action mailed Sep. 10, 2013 in Japanese Application No. 2010-003307 filed Jan. 8, 2010 (w/English translation).

* cited by examiner

*Primary Examiner* — Cuong Q Nguyen
(74) *Attorney, Agent, or Firm* — Oblon, Spivak, McClelland, Maier & Neustadt, L.L.P.

(57) ABSTRACT

A memory string is formed to surround the side surface of a columnar portion and a charge storing layer, and includes plural first conductive layers functioning as gates of memory transistors, and a first protecting layer stacked to protect an upper portion of the plural first conductive layers. The plural first conductive layers constitute a first stairway portion formed stepwise such that their ends are located at different positions. Each first conductive layer constitutes a step of the first stairway portion. A top surface of a first portion of the first stairway portion is covered with the first protecting layer including a first number of layers, and A tope surface of a second portion of the first stairway portion located at a lower level than the first portion is covered with the first protecting layer including a second number of layers fewer than the first number of layers.

17 Claims, 20 Drawing Sheets

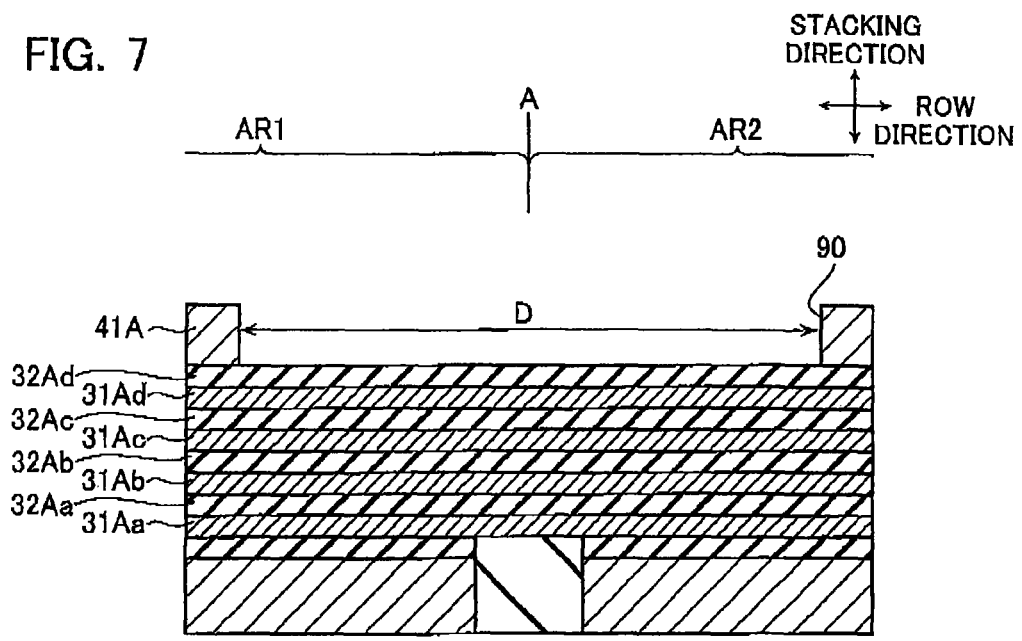
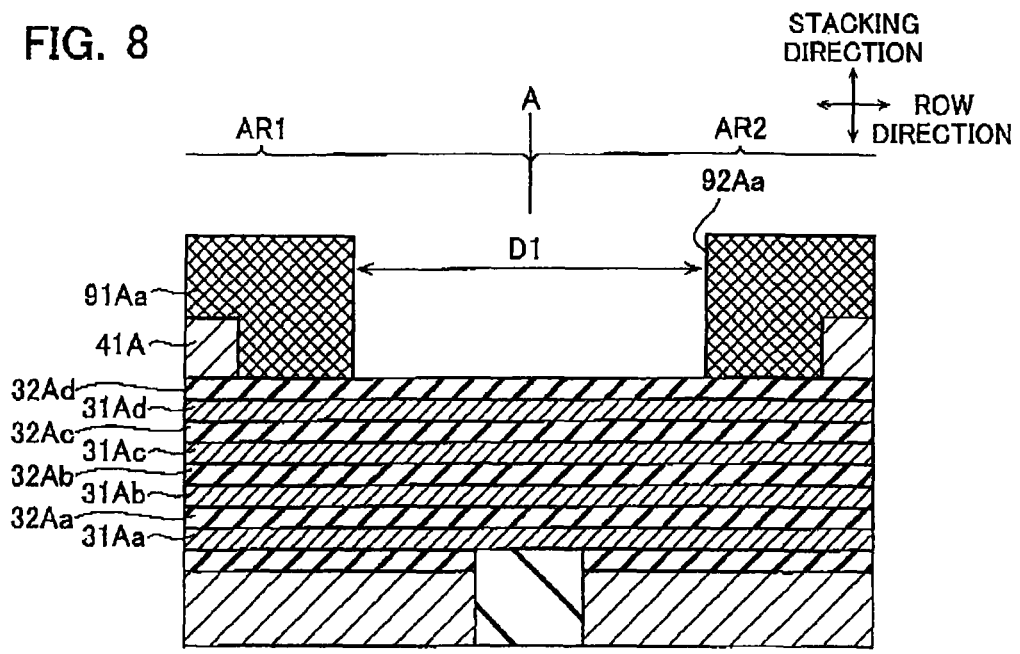

FIG. 21
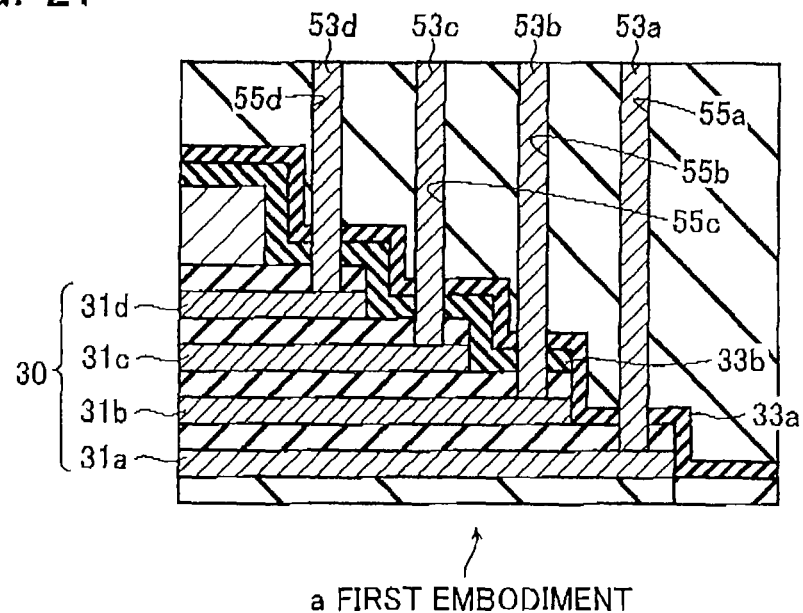
a FIRST EMBODIMENT
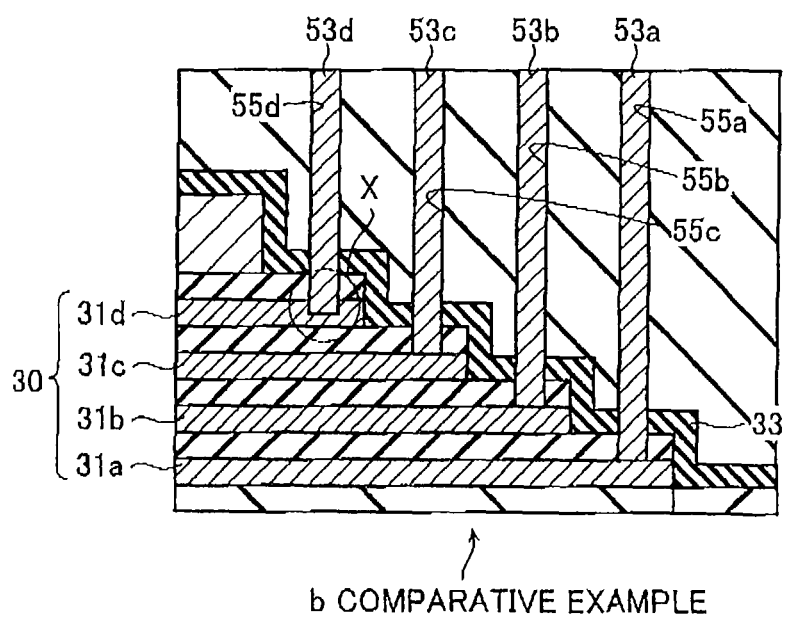
b COMPARATIVE EXAMPLE

NONVOLATILE SEMICONDUCTOR MEMORY DEVICE AND METHOD OF MANUFACTURING SAME

CROSS REFERENCE TO RELATED APPLICATIONS

This application is based upon and claims the benefit of priority from prior Japanese Patent Application No. 2010-3307, filed on Jan. 8, 2010, the entire contents of which are incorporated herein by reference.

BACKGROUND

In recent years, many semiconductor memory devices that include memory cells three-dimensionally in order to increase the degree of memory integration have been proposed (JP2007-266143A).

For example, one conventional semiconductor memory device that includes memory cells three-dimensionally uses transistors having a columnar structure (see JP2007-266143A). The transistors having a columnar structure include a columnar semiconductor layer having a columnar shape, a memory gate insulating layer, and multi-stacked conductive layers functioning as gate electrodes. The columnar semiconductor layer functions as a channel (body) of the transistors. The memory gate insulating layer is formed around the columnar semiconductor layer, and can store charges. The conductive layers are formed to surround the columnar semiconductor layer via the memory gate insulating layer. Such a three-dimensional structure can increase the memory capacity not by fine patterning but by multi-stacking, allowing process construction with techniques that are extended from conventional techniques.

In a manufacturing process of the above transistors having a columnar structure, electrical connection between the conductive layers and a wire provided above is formed via contact layers, which are formed to contact the multi-stacked conductive layers (gate electrodes) respectively. However, it is not easy to form the contact layers because they need to be formed to adjust to the height of the respective conductive layers. If the contact layers cannot be formed correctly, it is impossible to control the gates of the transistors accurately, spoiling the stability of the operation of the nonvolatile semiconductor memory device.

SUMMARY

A nonvolatile semiconductor memory device according to one aspect of the present invention includes a plurality of memory strings including a plurality of memory transistors connected in series, the memory transistors being electrically rewritable, the memory strings including: a first semiconductor layer including a columnar portion extending in a perpendicular direction relative to a substrate, the first semiconductor layer being configured to function as a body of the memory transistors; a charge storing layer formed to surround a side surface of the columnar portion and configured to store a charge; a plurality of first conductive layers formed to surround the side surface of the columnar portion and the charge storing layer and configured to function as gates of the memory transistors; and a first protecting layer stacked to protect a top portion of the plurality of first conductive layers, the plurality of first conductive layers constituting a first stairway portion formed stepwise such that ends of the first conductive layers are located at different positions, each of the first conductive layers constituting a step of the first stairway portion, a top surface of a first portion of the first stairway portion being covered with the first protecting layer including a first number of layers, and a top surface of a second portion of the first stairway portion located at a lower level than the first portion being covered with the first protecting layer including a second number of layers fewer than the first number of layers.

A method of manufacturing a nonvolatile semiconductor memory device according to one aspect of the present invention is a method of manufacturing a nonvolatile semiconductor memory device including a plurality of memory strings including a plurality of memory transistors connected in series, the memory transistors being electrically rewritable, the method including; stacking a plurality of conductive layers; forming a through hole to penetrate the plurality of conductive layers; forming a charge storing layer on a side surface of the through hole; forming a semiconductor layer to fill the through hole; forming a first stairway portion by processing those of the conductive layers between a topmost conductive layer and a fifth conductive layer as one of the conductive layers below the topmost conductive layer by a first number, such that ends of the plurality of conductive layers are located at different positions; forming a first protecting layer to cover the first stairway portion; dividing the first protecting layer, and forming a second stairway portion by processing those of the conductive layers below the fifth conductive layer, such that the ends of the plurality of conductive layers are located at different positions; and forming a second protecting layer to cover the first protecting layer and the second stairway portion.

BRIEF DESCRIPTION OF THE DRAWINGS

FIGS. 4, 6-20 are cross sections of the nonvolatile semiconductor memory device according to the first embodiment.

FIG. 21 shows schematic diagrams of nonvolatile semiconductor memory devices according to the first embodiment and a comparative example.

DETAILED DESCRIPTION

One embodiment of a nonvolatile semiconductor memory device according to the present invention will now be explained with reference to the drawings.

First Embodiment

Configuration

Figure 1:
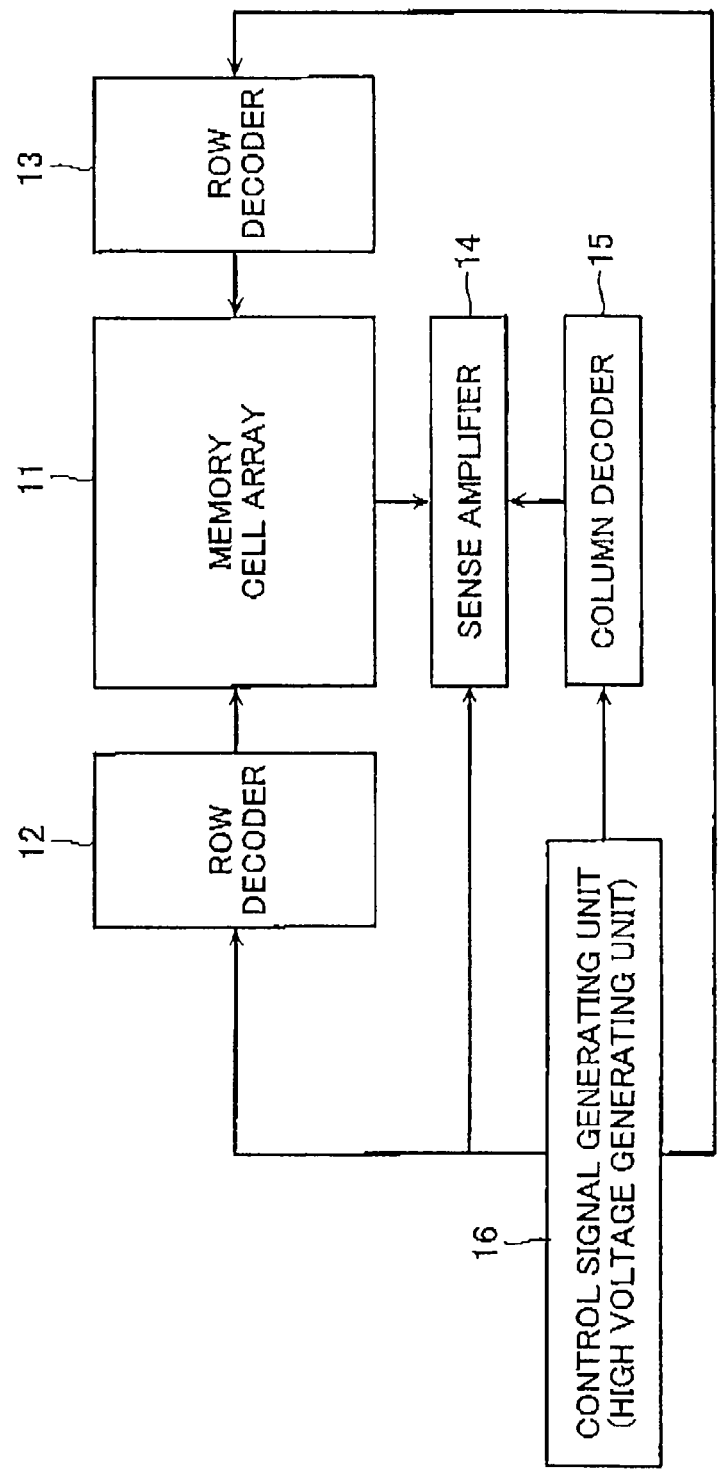
FIG. 1 is a block diagram of a nonvolatile semiconductor memory device according to a first embodiment of the present invention.
Figure 2:
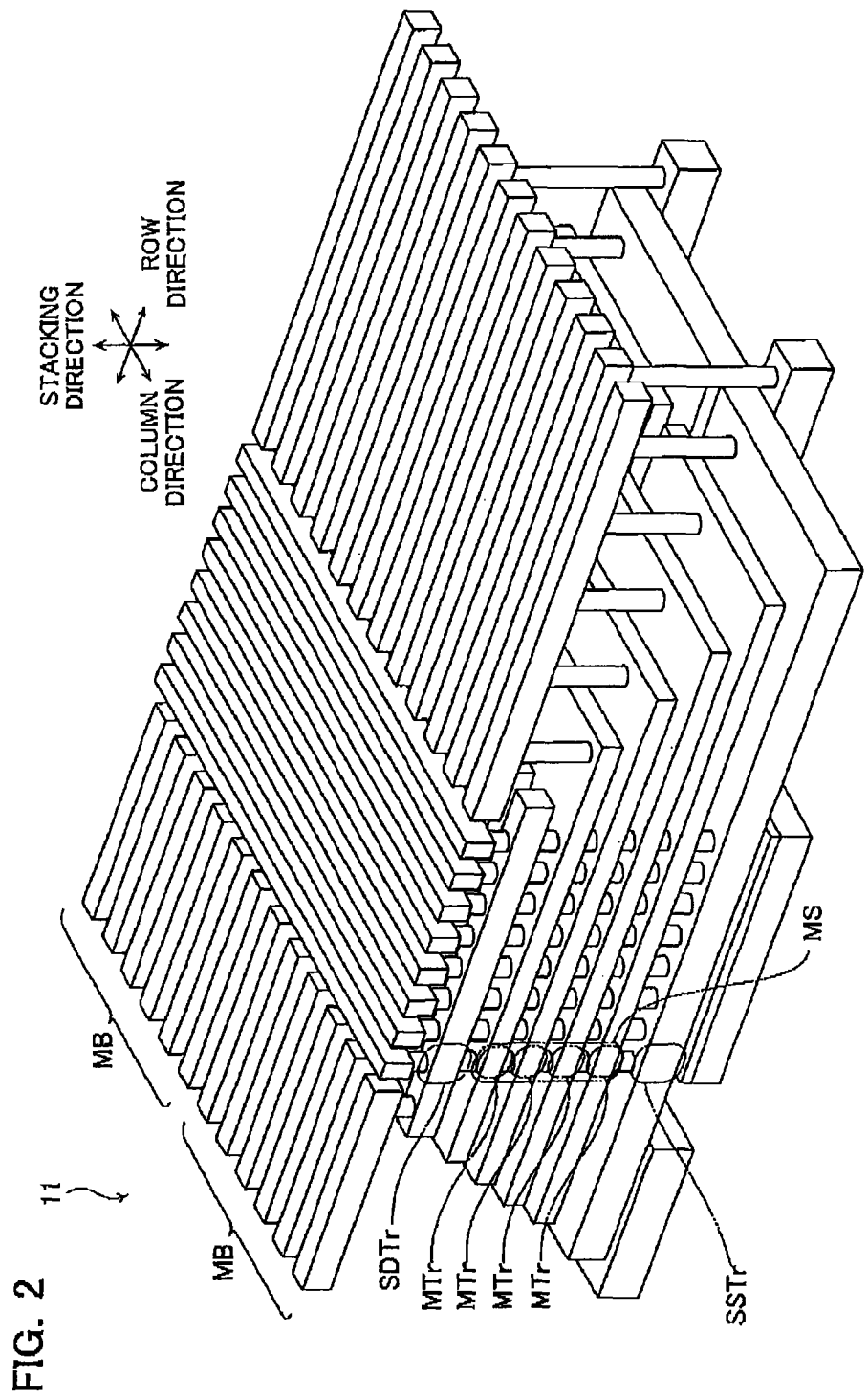
FIG. 2 is a schematic perspective diagram of the nonvolatile semiconductor memory device according to the first embodiment.

First, with reference to FIG. 1 and FIG. 2, the configuration of a nonvolatile semiconductor memory device according to the first embodiment will be explained. FIG. 1 is a block diagram of the nonvolatile semiconductor memory device according to the first embodiment of the present invention. FIG. 2 is a schematic perspective diagram of the nonvolatile semiconductor memory device.

As shown in FIG. 1, the nonvolatile semiconductor memory device according to the embodiment includes a memory cell array 11, row decoders 12 and 13, a sense amplifier 14, a column decoder 15, and a control signal generating unit (high voltage generating unit) 16.

As shown in FIG. 2, the memory cell array 11 is constituted by memory transistors MTr, which store data electrically, and which are arranged in a three-dimensional matrix formation. That is, the memory transistors MTr are arranged in a matrix formation horizontally, and also arranged in the stacking direction. A plurality of memory transistors MTr which are arranged side by side in the stacking direction are connected in series and form a well-known NAND string (memory string) MS. The memory string MS has its both ends connected respectively to a drain-side selector transistor SDTr and a source-side selector transistor SSTr, which come into electrical conduction when selected. The NAND string MS is disposed such that its longer side extends in the stacking direction.

As shown in FIG. 1, the row decoders 12 and 13 decode a received block address signal, etc. and control the memory cell array 11. The sense amplifier 14 reads out data from the memory cell array 11. The column decoder 15 decodes a column address signal and controls the sense amplifier 14. The control signal generating unit 16 generates a high voltage necessary for writing and erasing by stepping up a base voltage, and also generates a control signal and controls the row decoders 12 and 13, the sense amplifier 14, and the column decoder 15.

Figure 3:
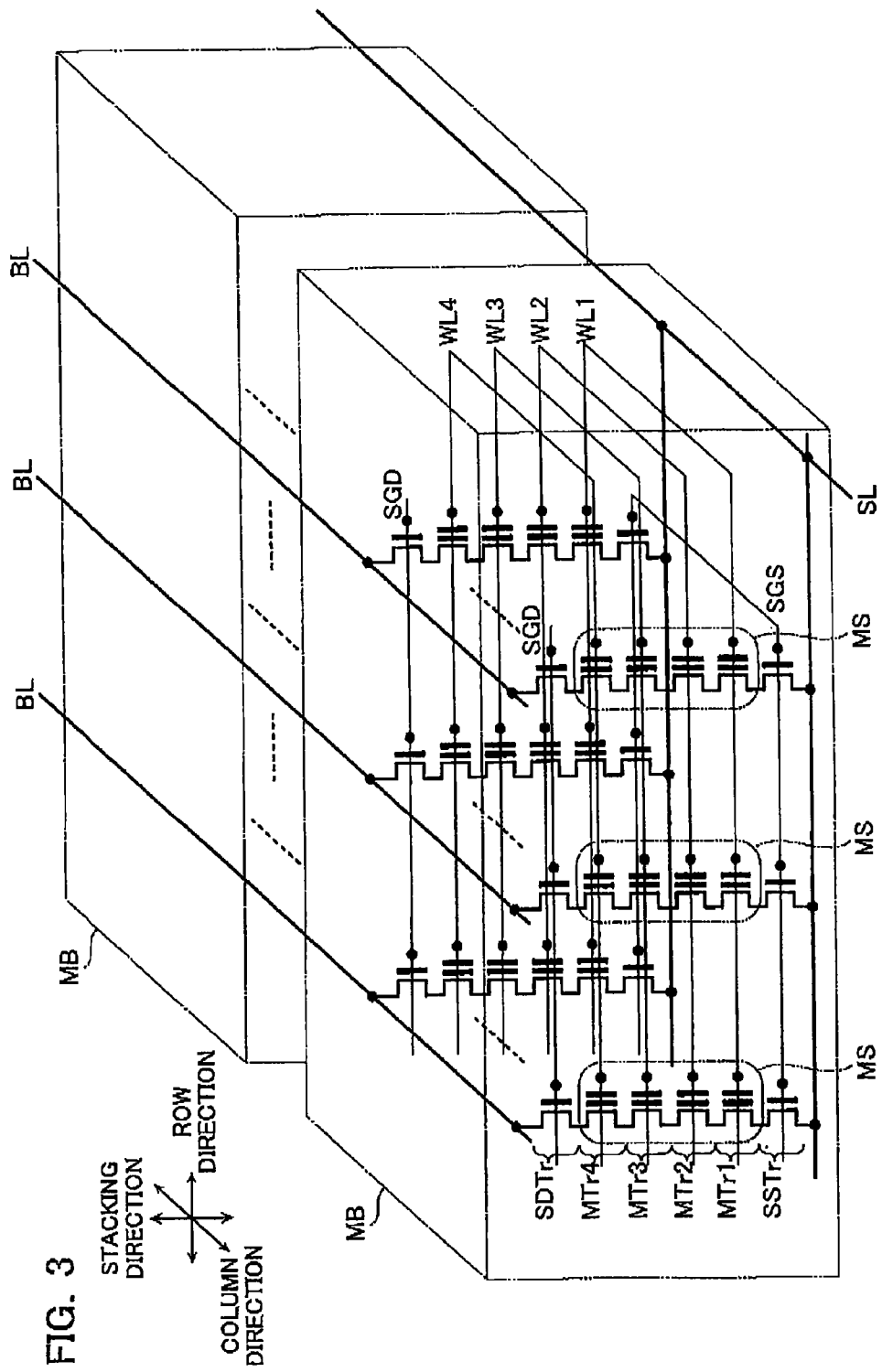
FIG. 3 is a circuit diagram of a memory cell array 11 shown in FIG. 2.

Next, with reference to FIG. 3, the circuit configuration of the memory cell array 11 will be explained. As shown in FIG. 3, the memory cell array 11 includes a plurality of memory blocks MB. A memory block MB includes a plurality of memory strings MS, source-side selector transistors SSTr, and drain-side selector transistors SDTr. A memory string MS includes memory transistors MTr1 to MTr4, which are connected in series. The drain-side selector transistor SDTr is connected to one end (the memory transistor MTr4) of the memory string MS. The source-side selector transistor SSTr is connected to the other end (the memory transistor MTr1) of the memory string MS. For example, such memory strings MS are provided in each memory block MB along plural row and plural columns in a matrix formation. The memory string MS may include more than four memory transistors.

As shown in FIG. 3, in the memory block MB, the control gates of the memory transistors MTr1 that are arranged in the matrix formation are connected in common to a word line WL1. Likewise, the control gates of the memory transistors MTr2 to MTr4 are connected in common to word lines WL2 to WL4 respectively.

As shown in FIG. 3, in the memory block MB, the control gates of the drain-side selector transistors SDTr which are arranged in line in the row direction are connected in common to a drain-side selector gate line SGD. The drain-side selector gate line SGD is formed to extend over a plurality of memory blocks MB in the row direction. One memory block MB includes a plurality of drain-side selector gate lines SGD, which are provided at a predetermined pitch in the column direction. The drain-side selector transistors SDTr which are arranged in line in the column direction have their other end connected to a bit line BL in common. The bit line BL is formed to extend over a plurality of memory blocks MB in the column direction. A plurality of bit lines BL are provided in the row direction.

As shown in FIG. 3, in one memory block MB, all the source-side selector transistors included therein have their control gates connected in common to a source-side selector gate line SGS. The source-side selector transistors SSTr have their other end connected in common to a source line SL.

Figure 4:
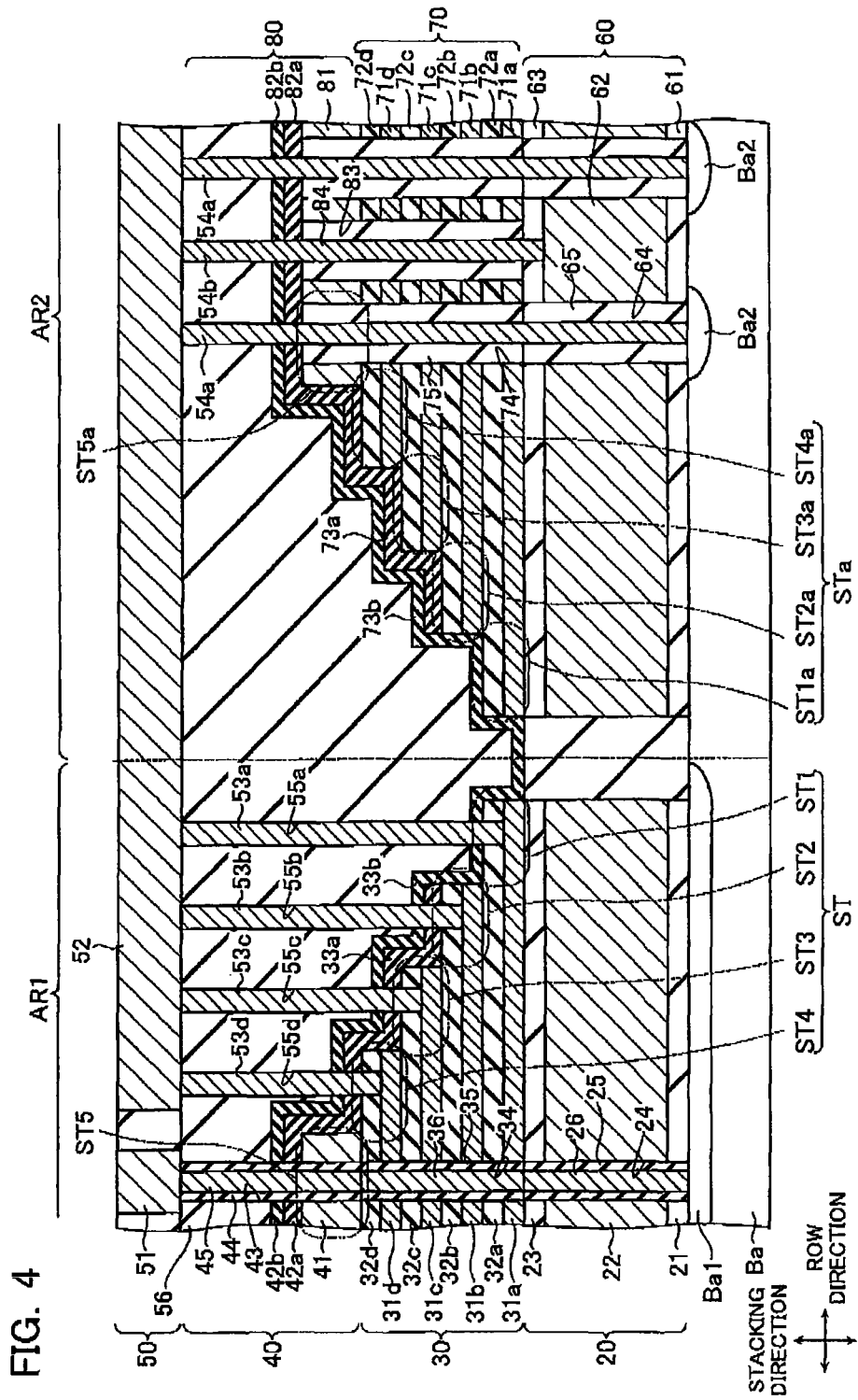

The above-described circuit configuration of the nonvolatile semiconductor memory device is obtained by a stacked structure shown in FIG. 4. FIG. 4 is a cross section of the nonvolatile semiconductor memory device according to the first embodiment.

As shown in FIG. 4, the nonvolatile semiconductor memory device according to the first embodiment is stacked within a memory region AR1 and a peripheral region AR2 of a semiconductor substrate Ba. The memory region AR1 functions as the memory cell array 11. The peripheral region AR2 is provided on the periphery of the memory region AR1 and functions as various control circuits (12 to 16).

First, with reference to FIG. 4, the memory region AR1 will be explained. As shown in FIG. 4, for each memory block MB, the memory region AR1 includes a source-side selector transistor layer 20, a memory transistor layer 30, a drain-side selector transistor layer 40, and a wiring layer 50, which are sequentially stacked on the semiconductor substrate Ba.

The semiconductor substrate Ba within the memory region AR1 functions as a source line SL. The source-side selector transistor layer 20 functions as the source-side selector transistors SSTr. The memory transistor layer 30 functions as the memory strings MS (memory transistors MTr1 to MTr4). The drain-side selector transistor layer 40 functions as the drain-side selector transistors SDTr. The wiring layer 50 functions as the bit lines BL and various other wires.

The semiconductor substrate Ba includes a diffused layer Ba1 in its top surface. The diffused layer Ba1 functions as the source line SL.

As shown in FIG. 4, the source-side selector transistor layer 20 includes an insulating layer 21, a source-side conductive layer 22, and an insulating layer 23, which are sequentially stacked above the semiconductor substrate Ba. The source-side conductive layer 22 functions as the gates of the source-side selector transistors SSTr and as the source-side selector gate line SGS. The source-side conductive layer 22 is formed to spread two-dimensionally (like a plate) in the row and column directions to cover one memory block MB.

The insulating layers 21 and 23 are made of silicon oxide ($SiO_2$). The source-side conductive layer 22 is made of polysilicon (poly-Si).

Further, as shown in FIG. 4, the source-side selector transistor layer 20 has source-side holes 24. The source-side holes 24 are formed to penetrate the insulating layer 21, the source-side conductive layer 22, and the insulating layer 23. The source-side holes 24 are provided in a matrix formation in the row and column directions.

Furthermore, as shown in FIG. 4, the source-side selector transistor layer 20 includes a source-side gate insulating layer 25 and a source-side columnar semiconductor layer 26. The source-side columnar semiconductor layer 26 functions as a body (channel) of the source-side selector transistor SSTr.

The source-side gate insulating layer 25 is formed on a side wall of the source-side hole 24 to have a predetermined thickness. The source-side columnar semiconductor layer 26 is formed to contact the side surface of the source-side gate insulating layer 25 and fill the source-side hole 24. The source-side columnar semiconductor layer 26 is formed in a columnar shape that extends in the stacking direction. The source-side columnar semiconductor layer 26 is formed on the diffused layer Ba1 of the semiconductor substrate Ba.

The source-side gate insulating layer 25 is made of silicon oxide ($SiO_2$). The source-side columnar semiconductor layer 26 is made of polysilicon (poly-Si).

To explain the above-configuration of the source-side selector transistor layer 20 in other words, the source-side gate insulating layer 25 is formed to surround the source-side columnar semiconductor layer 26. The source-side conductive layer 22 is formed to surround the source-side columnar semiconductor layer 26 via the source-side gate insulating layer 25.

As shown in FIG. 4, the memory transistor layer 30 includes word line conductive layers 31a to 31d, insulating layers 32a to 32d, and protecting layers 33a and 33b, which are stacked sequentially on the source-side selector transistor layer 20. The word line conductive layers 31a to 31d function as the gates of the memory transistors MTr1 to MTr4 and as the word lines WL1 to WL4. As will be described later, in the manufacturing process of the nonvolatile semiconductor memory device, holes 55a to 55d are formed from a layer provided above to reach the top surface of the word line conductive layers 31a to 31d. At this time, the protecting layers 33a and 33b protect the word line conductive layers 31a to 31d and prevent the holes 55a to 55d from becoming deeper than a predetermined depth.

The word line conductive layers 31a to 31d and the insulating layers 32a to 32d are formed to spread two-dimensionally (like a plate) in the row and column directions. The word line conductive layers 31a to 31d and the insulating layers 32a to 32d are divided memory block MB by memory block MB.

Further, as shown in FIG. 4, the word line conductive layers 31a to 31d and the insulating layers 32a to 32d are formed stepwise such that their row-direction ends facing the peripheral region AR2 are located at different positions. That is, the row-direction ends of the word line conductive layers 31a to 31d and insulating layers 32a to 32d constitute a stairway portion ST that is formed like a staircase. The stairway portion ST is formed to descend in the row direction toward the peripheral region AR2. The stairway portion ST includes steps (stages) ST1 to ST4 that are arranged side by side in one line in the row direction. As shown in FIG. 4, each of the steps ST1 to ST4 is constituted by an end portion of one of the word line conductive layers 31a to 31d and an end portion of one of the insulating layers 32a to 32d.

The protecting layer 33a covers side surfaces of row-direction end portions of the steps ST3 and ST4 (the word line conductive layers 31c and 31d and the insulating layers 32c and 32d). The protecting layer 33a also covers top surfaces of the steps ST2 to ST4 (the insulating layers 32b to 32d). The protecting layer 33b covers the protecting layer 33a. The protecting layer 33b also covers side surfaces of row-direction end portions of the steps ST1 and ST2 (the word line conductive layers 31a and 31b and the insulating layers 32a and 32b). The protecting layer 33b also covers a top surface of the step ST1 (the insulating layer 32a). That is, the steps ST2 to ST4 (first portion), which are the second or higher-order steps as counted upward from the bottom, have their top surface covered with two protecting layers 33a and 33b. The step ST1 (second portion located at a lower level than the first portion), which is the first step as counted upward from the bottom, has its top surface covered with one protecting layer 33b. In other words, the protecting layer 33a is not formed on the top surface of the step ST1.

The word line conductive layers 31a to 31d are made of polysilicon (poly-Si) The insulating layers 32a to 32d are made of silicon oxide ($SiO_2$). The protecting layers 33a and the protecting layers 33b are made of the same material, e.g., silicon nitride (SiN).

As shown in FIG. 4, the memory transistor layer 30 has memory holes 34. The memory holes 34 are formed to penetrate the word line conductive layers 31a to 31d and the insulating layers 32a to 32d. The memory holes 34 are provided in a matrix formation in the row and column directions. The memory holes 34 are formed at positions matching the source-side holes 24.

As shown in FIG. 4, the memory transistor layer 30 also includes a memory gate insulating layer 35 and a memory columnar semiconductor layer 36. The memory columnar semiconductor layer 36 functions as a body (channel) of the memory transistors MTr1 to MTr4.

The memory gate insulating layer 35 is formed on a side wall of the memory hole 34 to have a predetermined thickness. The memory columnar semiconductor layer 36 is formed to contact the side surface of the memory gate insulating layer 35 and fill the memory hole 34. The memory columnar semiconductor layer 36 is formed in a columnar shape that extends in the stacking direction. A bottom surface of the memory columnar semiconductor layer 36 contacts a top surface of the source-side columnar semiconductor layer 26.

Figure 5:
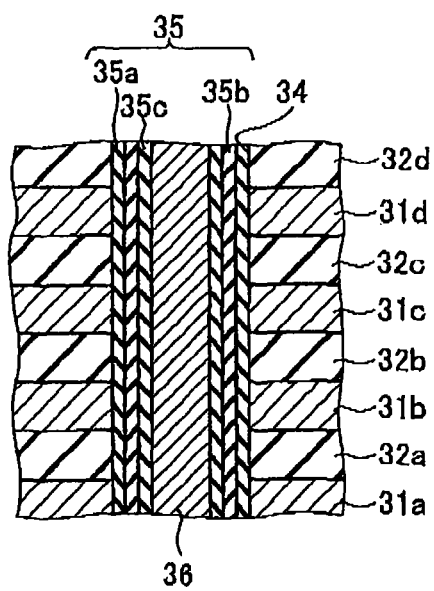
FIG. 5 is an expanded diagram of FIG. 4.

Now, with reference to FIG. 5, the configuration of the memory gate insulating layer 35 will be explained in detail. FIG. 5 is an expanded diagram of FIG. 4. The memory gate insulating layer 35 includes a block insulating layer 35a, a charge storing layer 35b, and a tunnel insulating layer 35c, which are formed in this order from the side surface of the memory hole 34 toward the memory columnar semiconductor layer 36. The charge storing layer 35b can store charges.

As shown in FIG. 5, the block insulating layer 35a is formed on the side wall of the memory hole 34 to have a predetermined thickness. The charge storing layer 35b is formed on a side wall of the block insulating layer 35a to have a predetermined thickness. The tunnel insulating layer 35c is formed on a side wall of the charge storing layer 35b to have a predetermined thickness.

The block insulating layer 35a and the tunnel insulating layer 35c are made of silicon oxide ($SiO_2$). The charge storing layer 35b is made of silicon nitride (SiN). The memory columnar semiconductor layer 36 is made of polysilicon (poly-Si).

To explain the above configuration of the memory transistor layer 30 in other words, the tunnel insulating layer 35c is formed to surround the memory columnar semiconductor layer 36. The charge storing layer 35b is formed to surround the tunnel insulating layer 35c. The block insulating layer 35a is formed to surround the charge storing layer 35b. The word line conductive layers 31a to 31d are formed to surround the block insulating layer 35a.

As shown in FIG. 4, the drain-side selector transistor layer 40 includes a drain-side conductive layer 41 and protecting layers 42a and 42b. The drain-side conductive layer 41 functions as the gates of the drain-side selector transistors SDTr and as the drain-side selector gate lines SGD.

The drain-side conductive layer 41 is stacked on the memory transistor layer 30. The drain-side conductive layer 41 is formed immediately above where the memory columnar semiconductor layers 36 are formed. The drain-side conductive layer 41 extends in the row direction and is formed as stripes that are provided at a predetermined pitch in the column direction. The drain-side conductive layer 41 is formed such that its row-direction end is located at a position that is different from the position of the row-direction end of the word line conductive layer 31d, thereby forming a step ST5.

The protecting layer 42a is formed to cover the drain-side conductive layer 41 and to be continuous and integral with the protecting layer 33a. The protecting layer 42b is formed to cover the protecting layer 42a and to be continuous and integral with the protecting layer 33b.

The drain-side conductive layer 41 is made of, for example, polysilicon (poly-Si). The protecting layers 42a and 42b are made of silicon nitride (SiN).

Further, as shown in FIG. 4, the drain-side selector transistor layer 90 has drain-side holes 43. The drain-side holes 43 are formed to penetrate the drain-side conductive layer 41 and the protecting layers 42a and 42b. The drain-side holes 43 are provided in a matrix formation in the row and column directions. The drain-side holes 43 are formed at positions matching the memory holes 34.

Furthermore, as shown in FIG. 4, the drain-side selector transistor layer 40 includes a drain-side gate insulating layer 44 and a drain-side columnar semiconductor layer 45. The drain-side columnar semiconductor layer 45 functions as a body (channel) of the drain-side selector transistor SDTr.

The drain-side gate insulating layer 44 is formed on a side wall of the drain-side hole 43 to have a predetermined thickness. The drain-side columnar semiconductor layer 45 is formed to contact the drain-side gate insulating layer 44 and fill the drain-side hole 43. The drain-side columnar semiconductor layer 45 is formed in a columnar shape that extends in the stacking direction. A bottom surface of the drain-side columnar semiconductor layer 45 contacts a top surface of the memory columnar semiconductor layer 36.

The drain-side gate insulating layer 44 is made of silicon oxide ($SiO_2$). The drain-side columnar semiconductor layer 45 is made of polysilicon (poly-Si).

To explain the above configuration of the drain-side selector transistor layer 90 in other words, the drain-side gate insulating layer 44 is formed to surround the drain-side columnar semiconductor layer 45. The drain-side conductive layer 41 is formed to surround the drain-side columnar semiconductor layer 45 via the drain-side gate insulating layer 44.

As shown in FIG. 4, the wiring layer 50 includes a first wiring layer 51, a second wiring layer 52, and contact plug layers 53a to 53d. The first wiring layer 51 functions as the bit lines BL. The second wiring layer 52 functions as various wires to be connected to the word lines WL1 to WL4.

The first wiring layer 51 and the second wiring layer 52 are formed in a layer above the drain-side selector transistor layer 40. The first wiring layer 51 is formed to contact a top surface of the drain-side columnar semiconductor layers 45. The first wiring layer 51 is formed at a predetermined pitch in the row direction to extend in the column direction. The second wiring layer 52 is formed at a predetermined pitch in the column direction to extend in the row direction. Each of the contact plug layers 53a to 53d is formed to connect a bottom surface of the second wiring layer 52 to a top surface of a corresponding one of the word line conductive layers 31a to 31d. The first wiring layer 51, the second wiring layer 52, and the contact plug layers 53 are made of tungsten (W).

The contact plug layers 53a to 53d will now be described in more detail. The contact plug layers 53a to 53d are formed in holes 55a to 55d. The holes 55a to 55d are formed to penetrate an interlayer insulating layer 56 that covers the source-side selector transistor layer 20, the memory transistor layer 30, and the drain-side selector transistor layer 90. The holes 55a to 55d are formed to also penetrate the protecting layers 33a and 33b and the respective insulating layers 32a to 32d.

Next, with reference to FIG. 4, the peripheral region AR2 will be explained. As shown in FIG. 4, the peripheral region AR2 includes a peripheral wiring layer 60, a first dummy layer 70, a second dummy layer 80, and the wiring layer 50, which are stacked sequentially on the semiconductor substrate Ba.

The semiconductor substrate Ba within the peripheral region AR2 functions as sources/drains of various transistors. The peripheral wiring layer 60 functions as transistors constituting the row decoder 12, etc. and as other wires. The first dummy layer 70 and the second dummy layer 80 are layers where contact plug layers are formed. These contact plug layers extend from a layer above the first dummy layer 70 and the second dummy layer 80 to the peripheral wiring layer 60 or to the semiconductor substrate Ba. The first dummy layer 70 and the second dummy layer 80 do not function as wires.

The semiconductor substrate Ba includes diffused layers Ba2 in its surface. The diffused layers Ba2 function as the source/drain of the transistors constituting the row decoder 12, etc.

As shown in FIG. 4, the peripheral wiring layer 60 is formed in the same layer as the source-side selector transistor layer 20. The first dummy layer 70 is formed in the same layer as the memory transistor layer 30. The second dummy layer 80 is formed in the same layer as the drain-side selector transistor layer 40. As will be described later, the peripheral wiring layer 60, the first dummy layer 70, and the second dummy layer 80 share the same layers as the source-side selector transistor layer 20, the memory transistor layer 30, and the drain-side selector transistor layer 40 when deposited, respectively, but are divided from them by etching. The wiring layer 50 is provided in common between the memory region AR1 and the peripheral region AR2.

The peripheral wiring layer 60 includes an insulating layer 61, a conductive layer 62, and an insulating layer 63, which are stacked sequentially on the semiconductor substrate Ba. The conductive layer 62 functions as the gate of the transistors constituting the row decoder 12 and as other wires. The insulating layer 61 is formed in the same layer as the insulating layer 21. The conductive layer 62 is formed in the same layer as the source-side conductive layer 22. The insulating layer 63 is formed in the same layer as the insulating layer 23.

Further, the peripheral wiring layer 60 has through holes 64 and interlayer insulating layers 65. The through holes 64 are formed to penetrate the insulating layer 61, the conductive layer 62, and the insulating layer 63. The through holes 64 are formed at positions matching the diffused layers Ba2. The interlayer insulating layers 65 are formed to fill the through holes 64.

As shown in FIG. 4, the dummy layer 70 includes conductive layers 71a to 71d, insulating layers 72a to 72d, and protecting layers 73a and 73b, which are sequentially stacked on the peripheral wiring layer 60.

The conductive layers 71a to 71d are formed in the same layers as the word line conductive layers 31a to 31d. The insulating layers 72a to 72d are formed in the same layers as the insulating layers 32a to 32d. The conductive layers 71a to 71d and the insulating layers 72a to 72d are formed stepwise such that their row-direction ends facing the memory region AR1 are located at different positions. That is, the row-direction ends of the conductive layers 71a to 71d and insulating layers 72a to 72d constitute a stairway portion STa that is formed like a staircase. The stairway portion STa is formed to descend in the row direction toward the memory region AR1.

The stairway portion STa includes steps (stages) ST1a to ST4a that are arranged side by side in one line in the row direction. As shown in FIG. 4, each of the steps ST1a to ST4a is constituted by an end portion of one of the conductive layers 71a to 71d and an end portion of one of the insulating layers 72a to 72d.

The protecting layer 73a covers side surfaces of the row-direction end portions of the steps ST3a and ST4a (the conductive layers 71c and 71d and the insulating layers 72c and 72d). The protecting layer 73a also covers top surfaces of the steps ST2a to ST4a (the insulating layers 72b to 72d). The protecting layer 73b covers the protecting layer 73a. The protecting layer 73b also, covers side surfaces of the row-direction end portions of the steps ST1a and ST2a (the conductive layers 71a and 71b and the insulating layers 72a and 72b). The protecting layer 73b also covers a top surface of the step ST1a (the insulating layer 72a). The protecting layer 73b is formed to be continuous and integral with the protecting layer 33b. That is, the steps ST2a to ST4a (first portion), which are the second or higher-order steps as counted upward from the bottom, have their top surface covered with two protecting layers 73a and 73b. The step ST1a (second portion located at a lower level than the first portion), which is the first step as counted upward from the bottom, has its top surface covered with one protecting layer 73b. In other words, the protecting layer 73a is not formed on the top surface of the step ST1a.

The first dummy layer 70 has through holes 74 and interlayer insulating layers 75. The through holes 74 are formed to penetrate the conductive layers 71a to 71d and the insulating layers 72a to 72d. The through holes 74 are formed at positions matching the through holes 64. The interlayer insulating layers 75 are formed to fill the through holes 74.

As shown in FIG. 4, the second dummy layer 80 includes a conductive layer 81 and protecting layers 82a and 82b, which are stacked on the first dummy layer 70.

The conductive layer 81 is formed in the same layer as the drain-side conductive layer 41. The conductive layer 81 is formed such that its row-direction end is located at a position different from the position of the row-direction end of the conductive layer 71d, thereby forming a step ST5a.

The protecting layer 82a is formed to cover the conductive layer 81 and to be continuous and integral with the protecting layer 73a. The protecting layer 82b is formed to cover the protecting layer 82a and to be continuous and integral with the protecting layer 73b.

The second dummy layer 80 has through holes 83 and interlayer insulating layers 84. The through holes 83 are formed to penetrate the conductive layer 81. The through holes 83 are formed at positions matching the through holes 74. The interlayer insulating layers 84 are formed to fill the through holes 83.

The wiring layer 50 includes a second wiring layer 52 and contact plug layers 54a and 54b. The contact plug layers 54a extend downward while penetrating the interlayer insulating layers 65, 75, and 84, thereby electrically connecting the second wiring layer 52 and the diffused layers Ba2. The contact plug layer 54b extends downward while penetrating the interlayer insulating layers 75 and 84, thereby electrically connecting the second wiring layer 52 and the conductive layer 62.

[Manufacturing Method]

Next, with reference to FIG. 6 to FIG. 20, a method of manufacturing the nonvolatile semiconductor memory device according to the first embodiment will be explained. FIG. 6 to FIG. 20 are cross sections showing the process of manufacturing the nonvolatile semiconductor memory device according to the first embodiment. The process to be shown below is a process after the source-side selector transistor layer 20 (the peripheral wiring layer 60) is formed.

Figure 6:
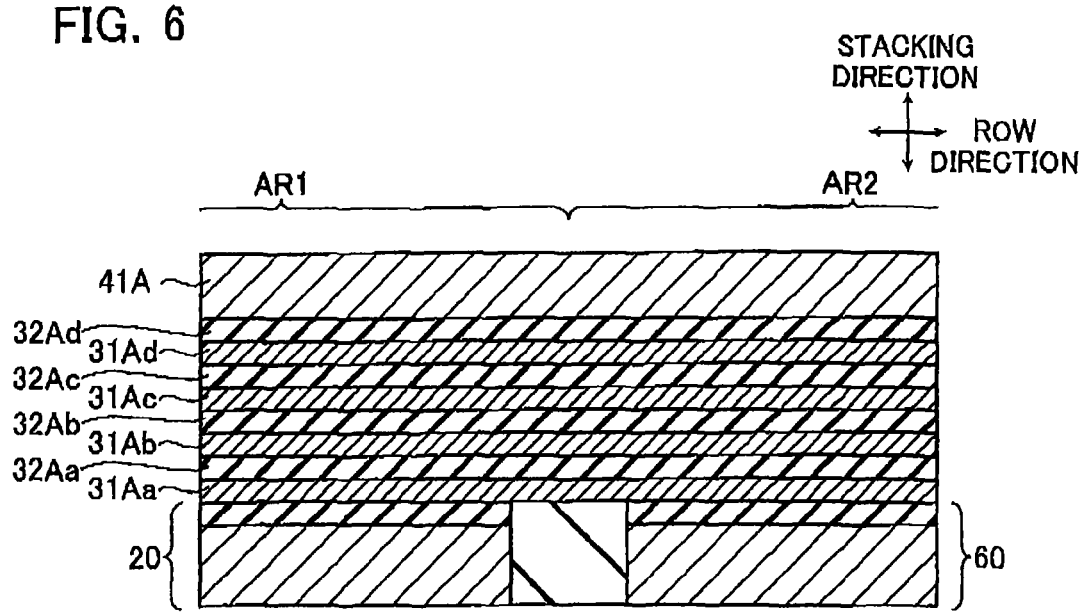

First, as shown in FIG. 6, polysilicon (poly-Si) and silicon oxide ($SiO_2$) are alternately deposited on the top surface of the source-side selector transistor layer 20 (the peripheral wiring layer 60) to form layers 31Aa to 31Ad, layers 32Aa to 32Ad, and a layer 41A. The layers 31Aa to 31Ad will later be processed into the word line conductive layers 31a to 31d and the conductive layers 71a to 71d. The layers 32Aa to 32Ad will later be processed into the insulating layers 32a to 32d and the insulating layers 72a to 72d. The layer 41A will later be processed into the drain-side conductive layer 41 and the conductive layer 81.

Next, as shown in FIG. 7, the layer 41A is pattern-etched to form a groove 90 therein. The groove 90 is formed to penetrate the layer 41A. The groove 90 has a width D in the row direction, the center of which is at the boundary A between the memory region AR1 and the peripheral region AR2.

Then, as shown in FIG. 8 to FIG. 11, a first stairway portion ST(1) is formed by processing the layers 31Ad and 31Ac, which are the topmost layer and the first layer as counted downward from the topmost layer 31Ad, such that the ends of the layers 31Ad and 31Ac are located at different positions. That is, first, as shown in FIG. 8, a resist layer 91Aa is formed to cover the layer 41A. Here, the resist layer 91Aa has a groove 92Aa that extends in the column direction. The groove 92Aa is formed to penetrate the resist layer 91Aa. The groove 92Aa has a width D1 (D1<D) in the row direction, the center of which is at the boundary A.

Figure 9:
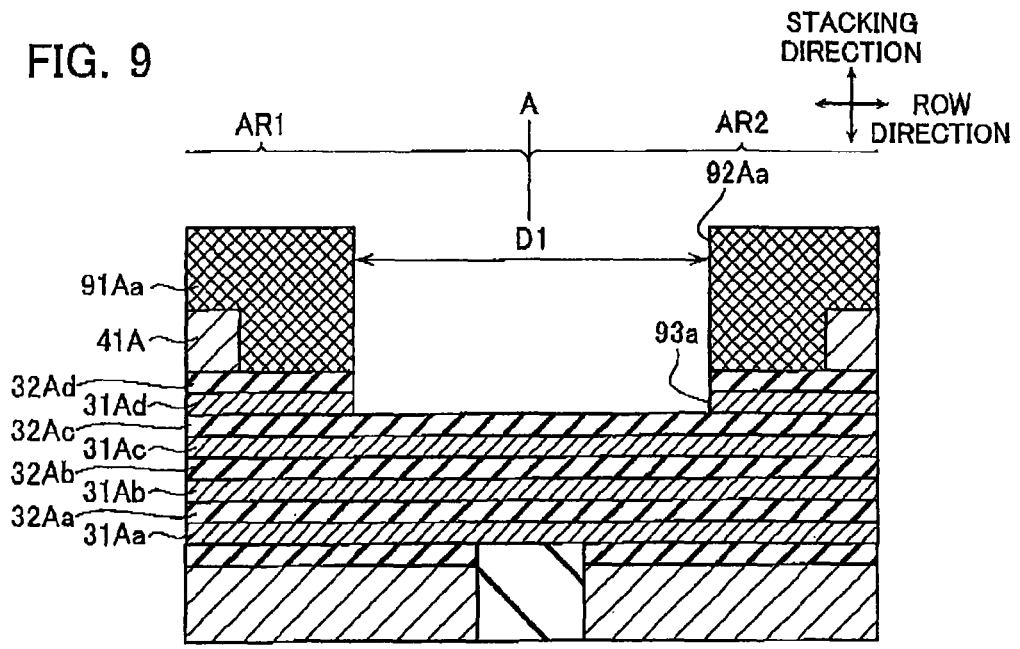

Next, as shown in FIG. 9, etching by using the resist layer 91Aa as a mask is carried out to form a groove 93a that penetrates the layer 31Ad and the layer 32Ad. The groove 93a has a width D1 in the row direction, the center of which is at the boundary A.

Figure 10:
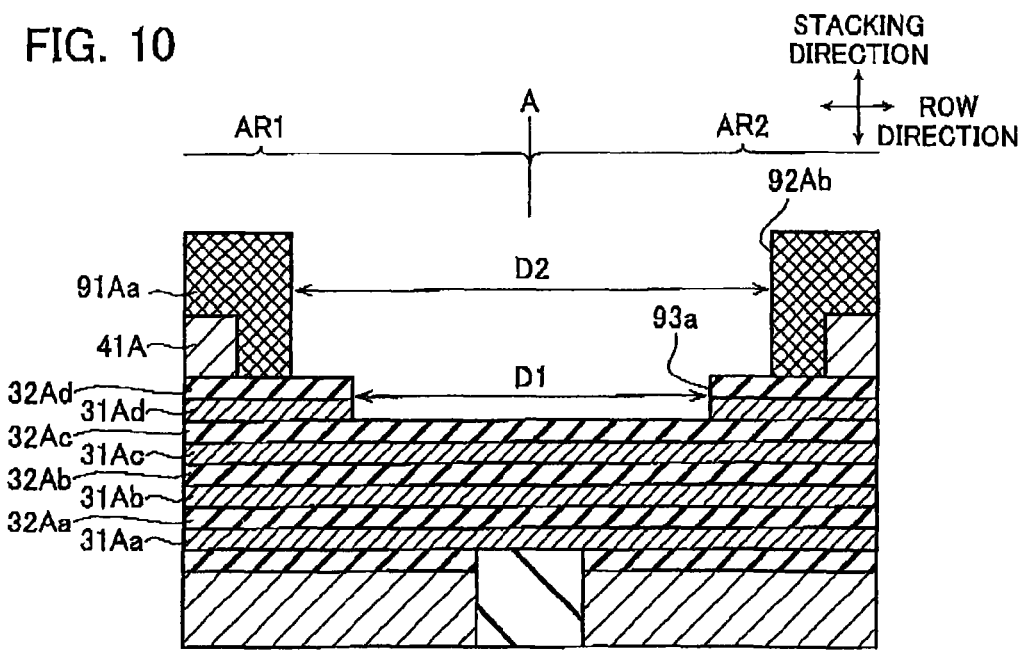

Next, as shown in FIG. 10, the resist layer 91Aa is slimmed in the row direction. Through this process, the resist layer 91Aa comes to have a groove 92Ab. The groove 92Ab has a width D2 (D1<D2<D) in the row direction, the center of which is at the boundary A.

Figure 11:
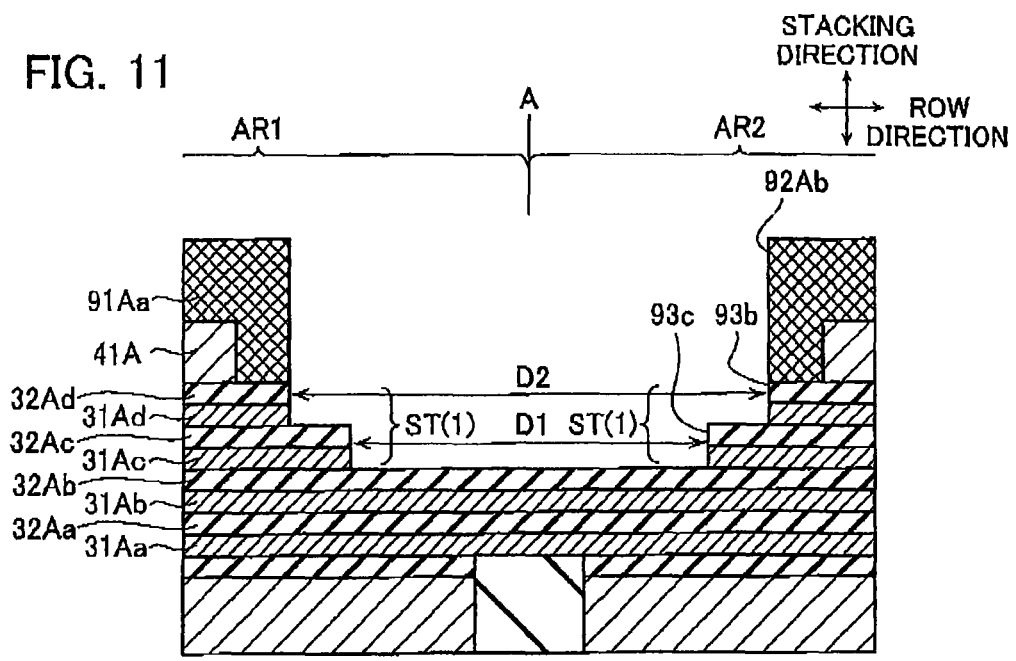

Then, as shown in FIG. 11, etching by using the resist layer 91Aa as a mask is carried out to form a groove 93b that penetrates the layer 31Ad and the layer 32Ad, and a groove 93c that penetrates the layer 31Ac and the layer 32Ac. The grooves 93b and 93c are formed to have their center located at the boundary A. The groove 93b has a width D2 in the row direction and the groove 93c has a width D1 in the row direction. Through this process, the layers 31Ad and 31Ac are processed to constitute the stairway portion ST(1), in which their ends are located at different positions.

Figure 12:
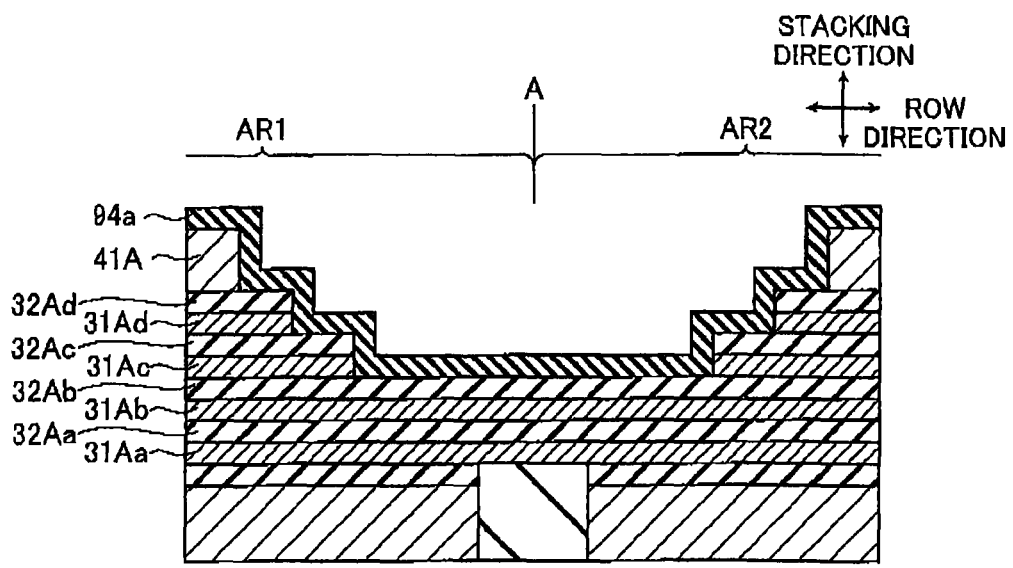

Next, as shown in FIG. 12, the resist layer 91Aa is removed, and silicon nitride is deposited to form a protecting layer 94a. The protecting layer 94a will later be processed into the protecting layers 33a, 92a, 73a, and 82a. The protecting layer 94a is formed to cover the stairway portion ST(1) (the layers 31Ad, 32Ad, 31Ac, 32Ac, and 32Ab).

Then, similarly to the above-described process, etching by using a resist layer as a mask and slimming of the resist layer are repeated alternately. As a result, the protecting layer 94a is divided. Further, the layers 31Ab and 31Aa, which are the second layer as counted downward from the topmost layer, and the first layer as counted downward from this layer, are processed such that the ends of the layers 31Ab and 31Aa are located at different positions, thereby forming a stairway portion ST(2).

Figure 13:
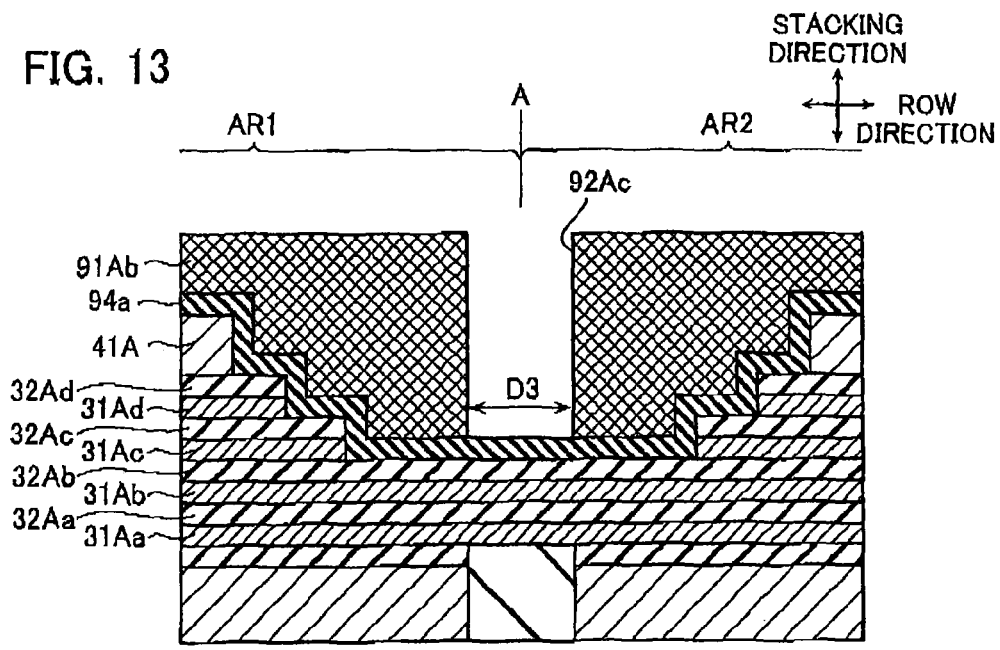

That is, as shown in FIG. 13, a resist layer 91Ab is formed on the protecting layer 94a. Here, the resist layer 91Ab has a groove 92Ac that extends in the column direction. The groove 92Ac is formed to penetrate the resist layer 91Ab. The groove 92Ac has a width D3 (D3<D1) in the row direction, the center of which is at the boundary A.

Figure 14:
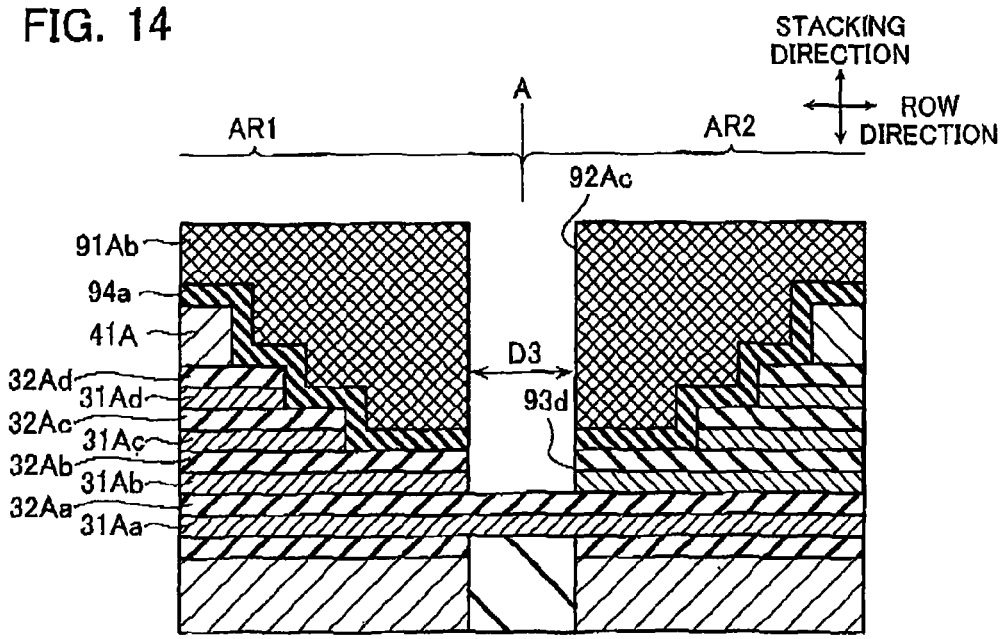

Next, as shown in FIG. 14, etching by using the resist layer 91Ab as a mask is carried out to form a groove 93d that penetrates the layer 31Ab, the layer 32Ab, and the protecting layer 94a. The groove 93d has a width D3 in the row direction, the center of which is at the boundary A.

Figure 15:
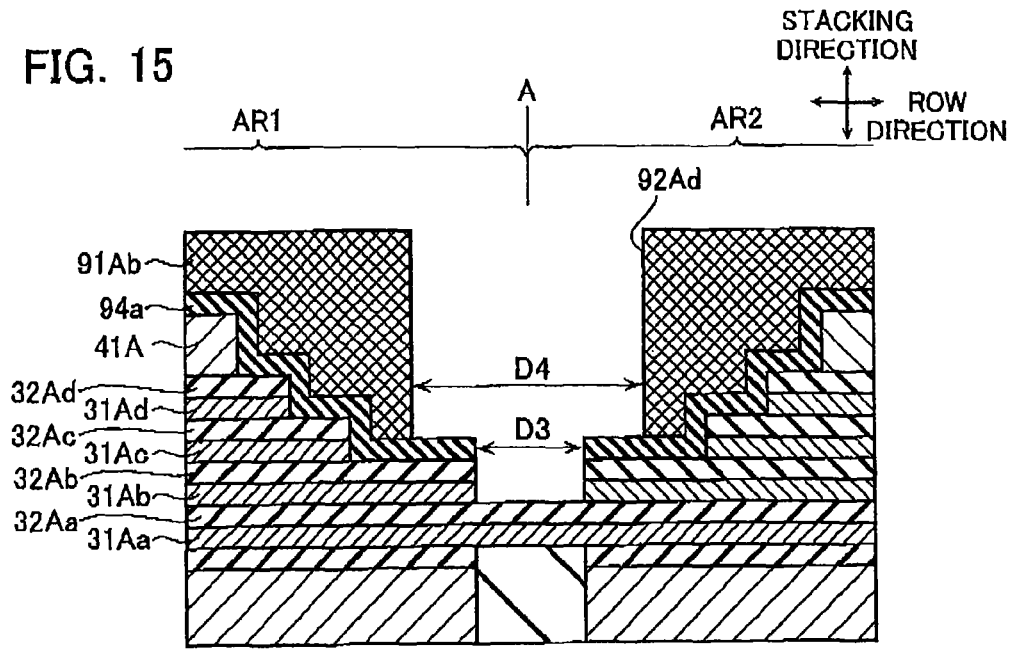

Then, as shown in FIG. 15, the resist layer 91Ab is slimmed in the row direction. Through this process, the resist layer 91Ab comes to have a groove 92Ad. The groove 92Ad has a width D4 (D3<D4<D1) in the row direction, the center of which is at the boundary A.

Figure 16:
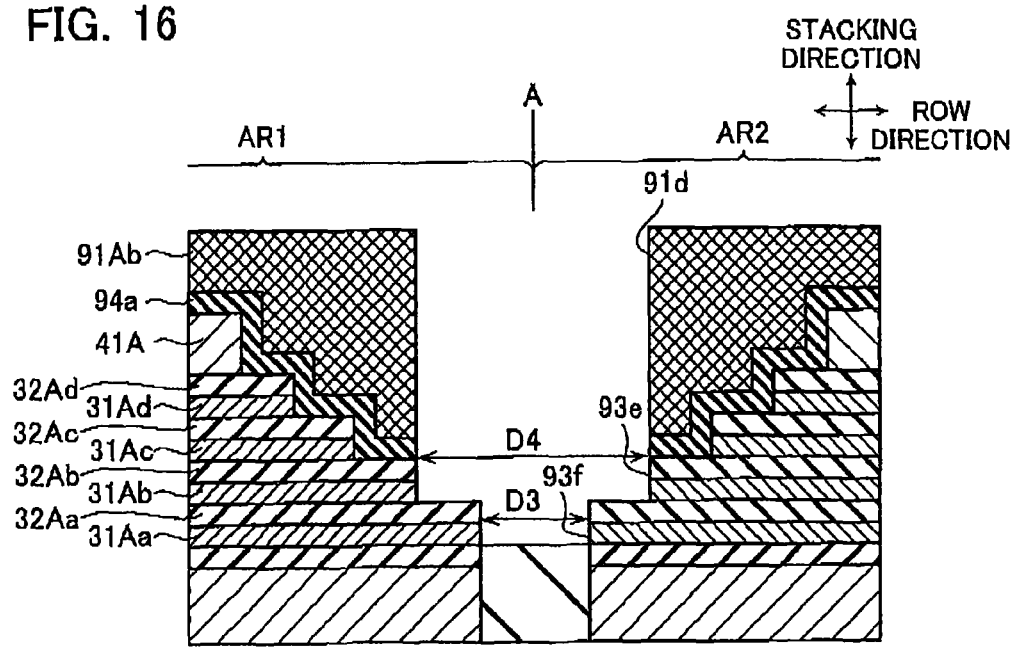

Next, as shown in FIG. 16, etching by using the resist layer 91Ab as a mask is carried out to form a groove 93e and a groove 93f. The groove 93e is formed to penetrate the layer 31Ab, the layer 32Ab, and the protecting layer 94a, and the groove 93f is formed to penetrate the layer 31Aa and the layer 32Aa. The grooves 93e and 93f are formed to have their center located at the boundary A. The groove 93e has a width D4 in the row direction. The groove 93f has a width D3 in the row direction.

Figure 17:
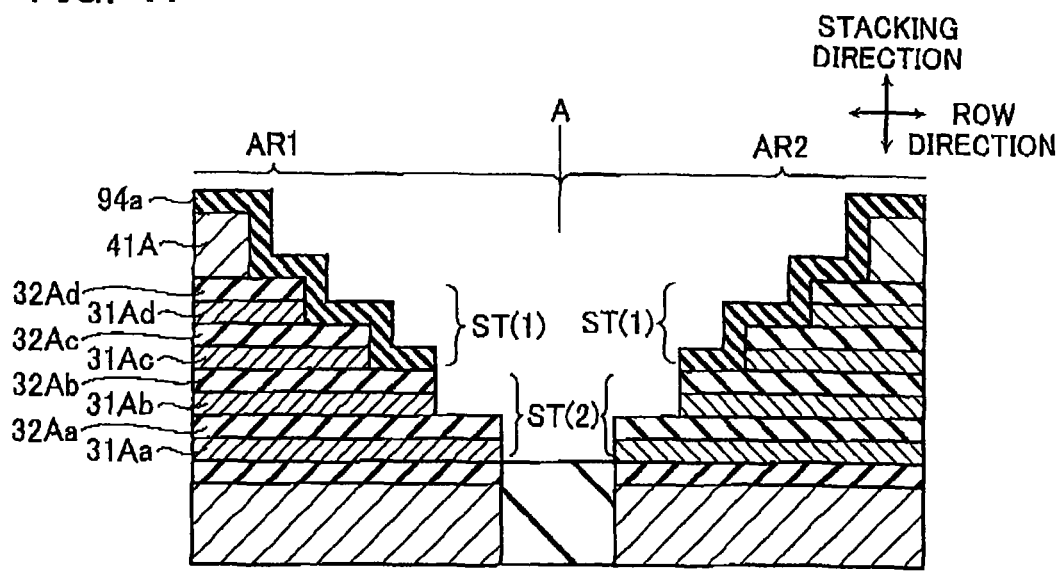

Next, as shown in FIG. 17, the resist layer 91Ab is removed. Through this process, the layers 31Ab and 31Aa are processed to constitute the stairway portion ST(2), in which their ends are located at different positions.

Figure 18:
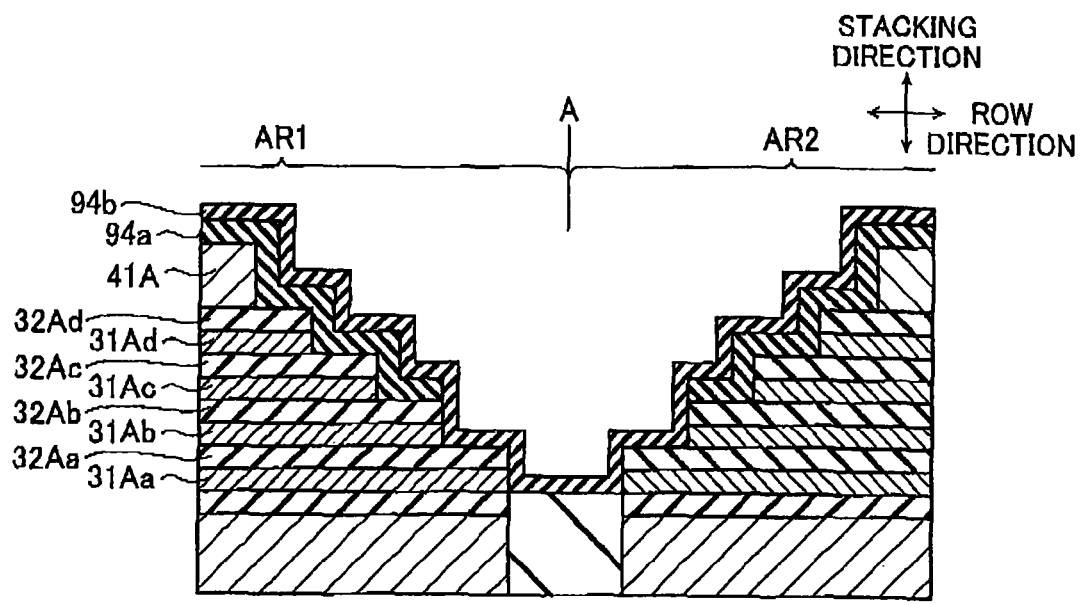

Then, as shown in FIG. 18, silicon nitride is deposited to form a protecting layer 94b on the protecting layer 94a. The protecting layer 94b will later be processed into the protecting layers 33b, 42b, 73b, and 82b. The protecting layer 94b is formed to cover the second stairway portion ST(2) (the layers 31Ab and 31Aa) and the protecting layer 94a.

Figure 19:
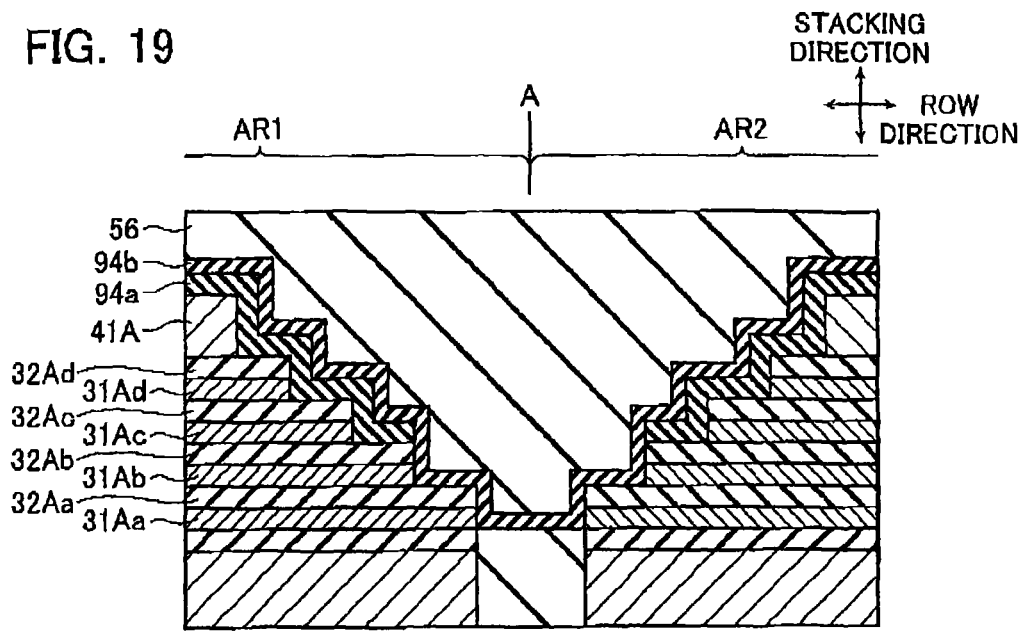

Next, as shown in FIG. 19, silicon oxide is deposited to form the interlayer insulating layer 56. A top surface of the interlayer insulating layer 56 is planarized by CMP.

Figure 20:
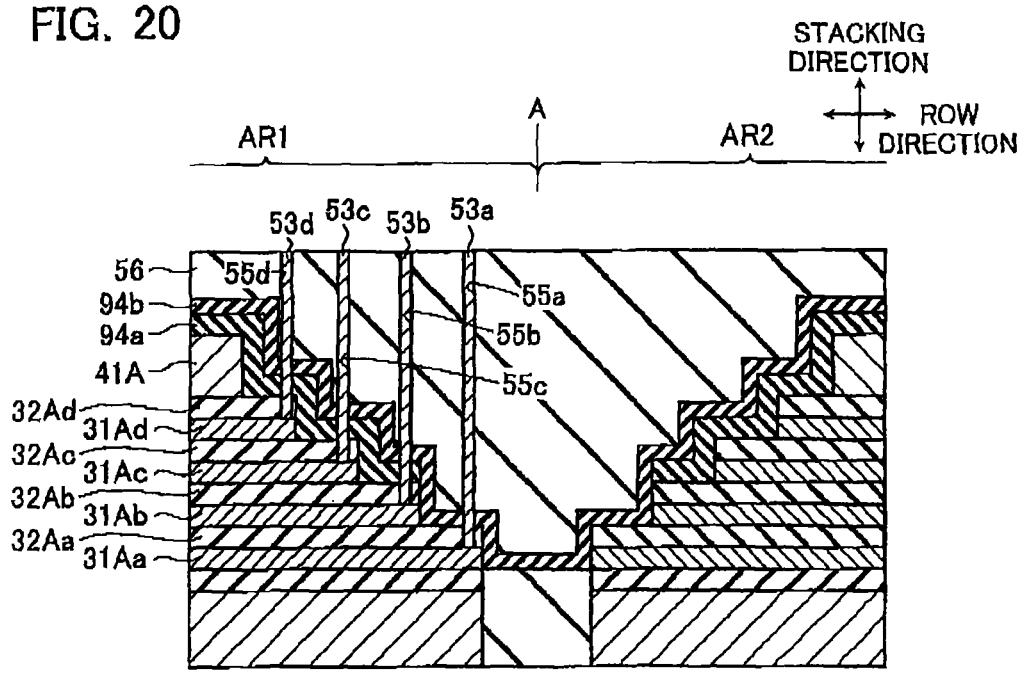

Next, as shown in FIG. 20, the holes 55a to 55d that penetrate the interlayer insulating layer 56 are formed, and tungsten is deposited to fill the holes 55a to 55d, whereby the contact plug layers 53a to 53d are formed. Here, in the formation of the holes 55a to 55d, reactive ion etching is used under a processing condition in which etching selectivity of the protecting layers 94a and 94b is high. This makes it possible to simultaneously form the contact plug layers 53a to 53d, which have different lengths in the stacking direction.

[Advantages]

Next, with reference to FIG. 21, the first embodiment will be shown in contrast with a comparative example to explain advantages of the first embodiment. Here, in the first embodiment, as shown in FIG. 21(a), the memory transistor layer 30 includes two protecting layers 33a and 33b, which are formed over different regions. On the other hand, in the comparative example, as shown in FIG. 21(b), the memory transistor layer 30 includes only one protecting layer 33.

Here, the shorter the length of the holes 55a to 55d in the stacking direction is, the more the protecting layer 33 (33a, 33b) is etched when the holes 55a to 55d are formed. Hence, in the comparative example, as indicated by a symbol X in FIG. 21(b), the hole 55d is formed to dig into the topmost word line conductive layer 31d. That is, in the comparative example, the word line conductive layer 31d becomes deficient.

As compared with this, in the first embodiment, as shown in FIG. 21(a), one protecting layer 33a is formed above the word line conductive layer 31a above which a long hole 55a is formed, while two protecting layers 33a and 33b are formed above the word line conductive layer 31d above which a short hole 55d is formed. The number (thickness) of protecting layers 33a and 33b to be stacked is determined in accordance with the length of the holes 55a to 55d, and hence the word line conductive layer 31d will not become deficient like it does in the comparative example. That is, the first embodiment can realize a stable operation.

Here, if the protecting layer 33a and the protecting layer 33b are made of different materials, the processing condition changes at the interface between the protecting layer 33a and the protecting layer 33b. Hence, during the processing, the tapered shape of the holes 55a to 55d changes at the interface to deform the shape of the contact plug layers 53a to 53d.

As compared with this, in the first embodiment, the protecting layer 33a and the protecting layer 33b are made of the same material and have the same etching rate. Hence, the protecting layers 33a and 33b are processed under the same processing condition. Therefore, the tapered shape of the holes 55a to 55d will not change at the interface between the protecting layers 33a and 33b and the shape of the contact plug layers 53a to 53d will not deform.

Second Embodiment

Configuration

Next, with reference to FIG. 22, the configuration of a nonvolatile semiconductor memory device according to the second embodiment will be explained. FIG. 22(a) is a perspective diagram showing a stairway portion STb of the nonvolatile semiconductor memory device according to the second embodiment. FIG. 22(b) is a perspective diagram showing a state obtained by peeling a protecting layer 33d from FIG. 22(a). FIG. 22(c) is a perspective diagram showing a state obtained by peeling a protecting layer 33c from FIG. 22(b). Any components of the second embodiment that are the same as those of the first embodiment will be denoted by the same reference numerals and not be explained repeatedly.

An overall configuration of the nonvolatile semiconductor memory device according to the second embodiment is the same as that of the first embodiment (FIG. 1 to FIG. 5). Though the details will be described later, the nonvolatile semiconductor memory device according to the second embodiment includes steps STb1 to STb8 (the stairway portion STb) arranged in a matrix formation in the row and column directions, and protecting layers 33c and 33d that cover the steps STb1 to STb8, as shown in FIG. 22. The second embodiment differs from the first embodiment in this point.

Figure 22:
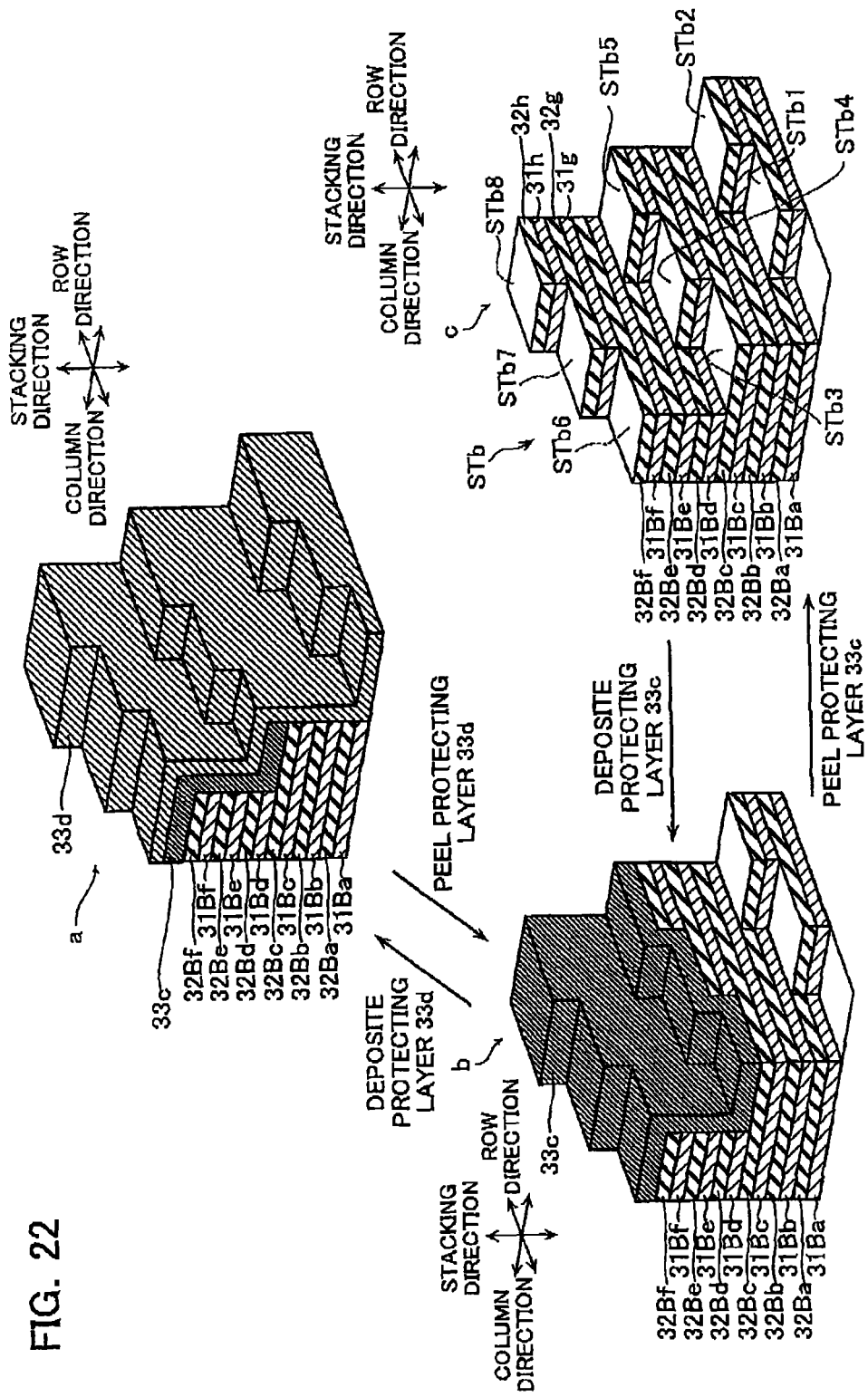
FIGS. 22-28 show schematic perspective diagrams showing a nonvolatile semiconductor memory device according to a second embodiment of the present invention.

As shown in FIG. 22, the memory transistor layer 30 includes word line conductive layers 31Ba to 31Bh and insulating layers 32Ba to 32Bh, which are stacked alternately. Similarly to the first embodiment, the word line conductive layers 31Ba to 31Bh and the insulating layers 32Ba to 32Bh are provided memory block MB by memory block MB, and spread two-dimensionally (like a plate) in the row and column directions.

As shown in FIG. 22, in the vicinity of a row-direction end of the memory region AR1, the word line conductive layers 31Ba to 31Bh and the insulating layers 32Ba to 32Bh are formed stepwise such that their row-direction and column-direction ends are located at different positions. That is, the row-direction and column-direction ends of the word line conductive layers 31Ba to 31Bh and insulating layers 32Ba to 32Bh constitute a stairway portion STb that is formed like a staircase. The stairway portion STb includes steps (stages) STb1 to STb8, which are arranged in a matrix formation in the row and column directions.

As shown in FIG. 22(c), the steps STb1 to STb8 are located in a matrix formation that has three rows and three columns. The step STb1 is located at a position on the second row and the first column. The step STb2 is located at a position on the third row and the first column. The step STb3 is located at a position on the first row and the second column. The step STb4 is located at a position on the second row and the second column. The step STb5 is located at a position on the third row and the second column. The step STb6 is located at a position on the first row and the third column. The step STb7 is located at a position on the second row and the third column. The step STb8 is located at a position on the third row and the third column. The steps STb1 to STb8 are located in lower layers to upper layers sequentially. Each of the steps STb1 to STb8 has a stacked structure of one of the word line conductive layers 31Ba to 31Bh and one of the insulating layers 32Ba to 32Bh.

The memory transistor layer 30 also has protecting layers 33c and 33d that cover the word line conductive layers 31Ba to 31Bh and the insulating layers 32Ba to 32Bh, as shown in FIGS. 22(a) and (b).

The protecting layer 33c covers side surfaces of column-direction and row-direction ends of the steps STb6 to STb8. The protecting layer 33c covers side surfaces of row-direction ends of the steps STb3 to STb5. The protecting layer 33c also covers top surfaces of the steps STb3 to STb8. The protecting layer 33d covers the protecting layer 33c. The protecting layer 33d covers side surfaces of column-direction ends of the steps STb1 to STb5. The protecting layer 33d covers side surfaces of row-direction ends of the steps STb1 and STb2. The protecting layer 33d also covers top surfaces of the steps STb1 and STb2. That is, a plurality of steps STb3 to STb8 (first portion), which are located on the second and third columns, are covered with two protecting layers 33c and 33d, and a plurality of steps STb1 and STb2 (second portion located at a lower level than the first portion), which are located on the first column, are covered with one protecting layer 33d. In other words, the protecting layer 33c is not formed on the top surface of the steps STb1 and STb2.

Though not shown in FIG. 22, contact plug layers are formed on the top surface of the word line conductive layers 31Ba to 31Bh in the respective steps STb1 to STb8, similarly to the first embodiment.

[Manufacturing Method]

Next, with reference to FIG. 22 to FIG. 28, a method of manufacturing the nonvolatile semiconductor memory device according to the second embodiment will be explained. FIG. 23 to FIG. 28 are schematic perspective diagrams showing the process of manufacturing the nonvolatile semiconductor memory device according to the second embodiment.

Figure 23:
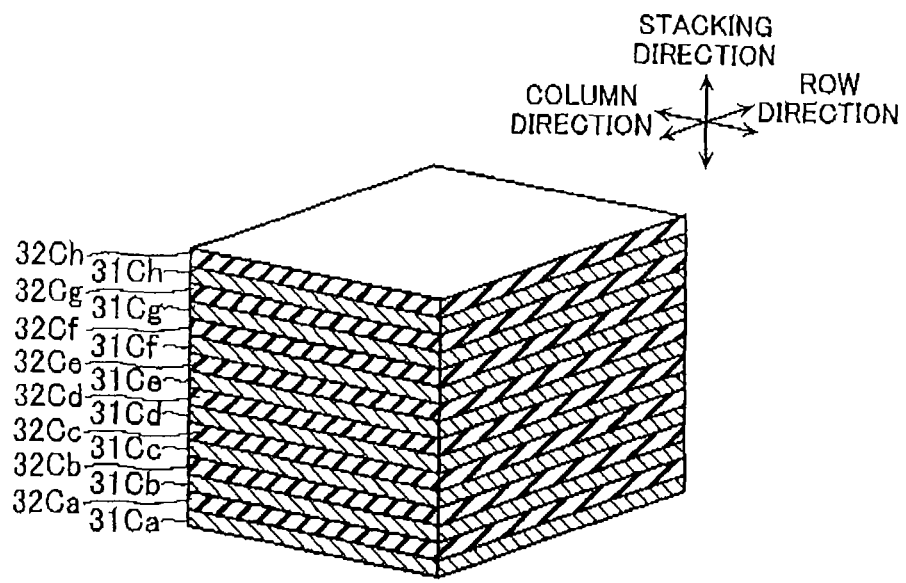

First, as shown in FIG. 23, polysilicon (p-Si) and silicon oxide ($SiO_2$) are alternately deposited to form layers 31Ca to 31Ch and layers 32Ca to 32Ch. The layers 31Ca to 31Ch will later be processed into the word line conductive layers 31Ba to 31Bh The layers 32Ca to 32Ch will later be processed into the insulating layers 32Ba to 32Bh.

Figure 24:
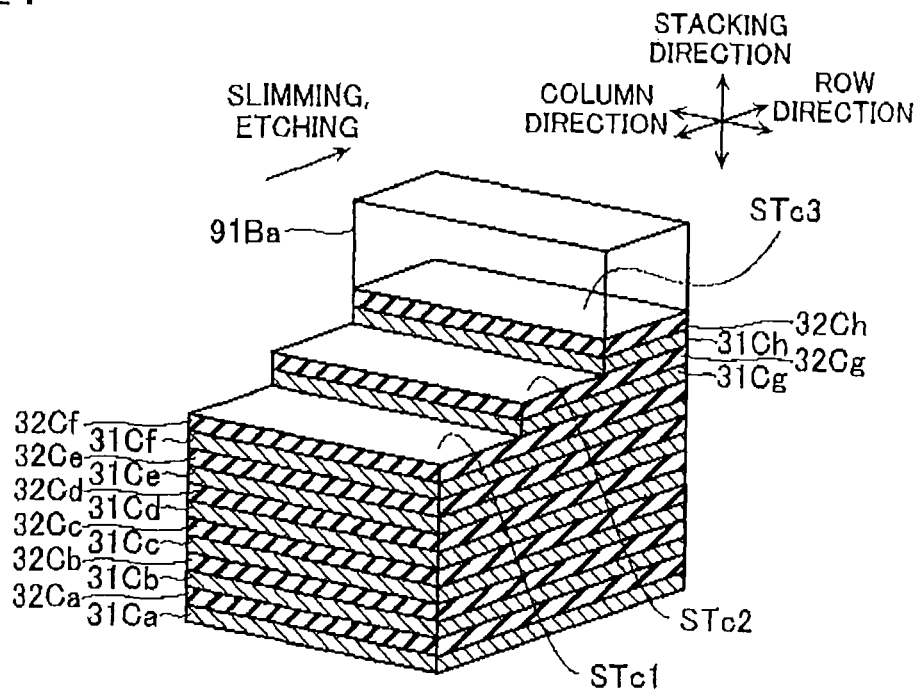

Next, a resist layer 91Ba is formed. Then, as shown in FIG. 24, slimming of the resist layer 91Ba in the row direction and etching are repeatedly carried out. As a result, three rows of steps STc1 to STc3 are formed at equal intervals in the row direction. The step STc1 is constituted by row-direction end portions of the layers 31Ca to 31Cf and layers 32Ca to 32Cf. The step STc2 is constituted by row-direction end portions of the layer 31Cg and layer 32Cg. The step STc3 is constituted by row-direction end portions of the layer 31Ch and layer 32ch.

Figure 25:
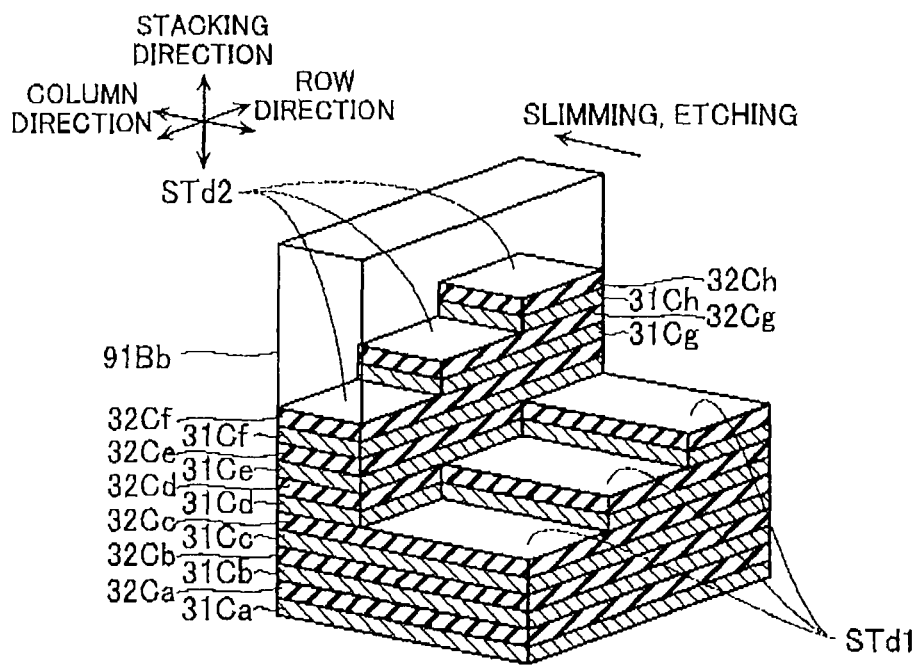

Then, the resist layer 91Ba is removed, and a resist layer 91Bb is newly formed. Then, as shown in FIG. 25, slimming of the resist layer 913b in the column direction and etching are repeatedly carried out. As a result, two columns of steps STd1 and STd2 are formed. The lower step STd1 is formed to have a larger width in the column direction than that of the upper step STd2. The step STd1 is constituted by column-direction end portions of the layers 31Ca to 31Ce and layers 32Ca to 32Ce. The step STd2 is constituted by column-direction end portions of the layers 31Cd to 31Ch and layers 32Cd to 32Ch.

Figure 26:
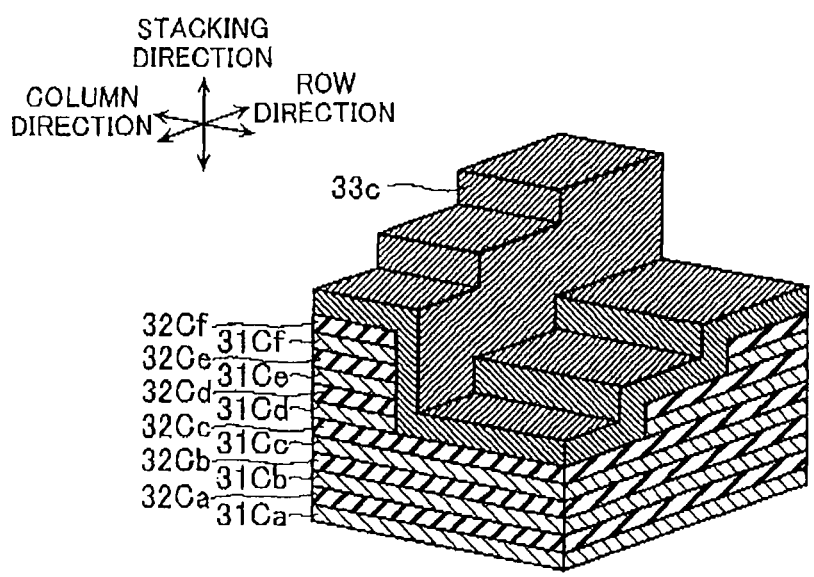
Figure 27:
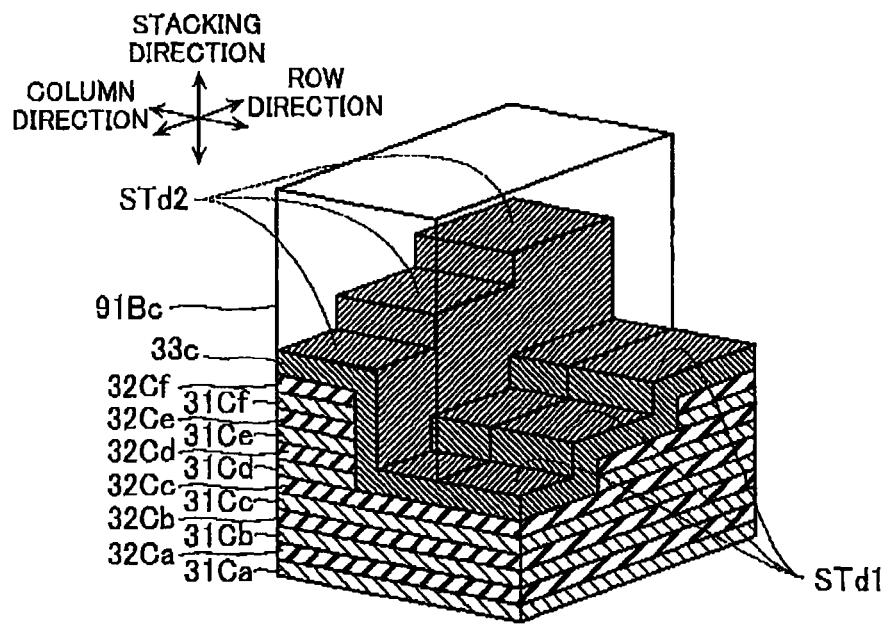

Next, as shown in FIG. 26, after the resist layer 91Bb is removed, silicon nitride is deposited to form the protecting layer 33c. Then, as shown in FIG. 27, a resist layer 91Bc is formed. The resist layer 91Bc is formed to cover the protecting layer 33c on the step STd2 and the protecting layer 33c on a partial region of the step STd1.

Figure 28:
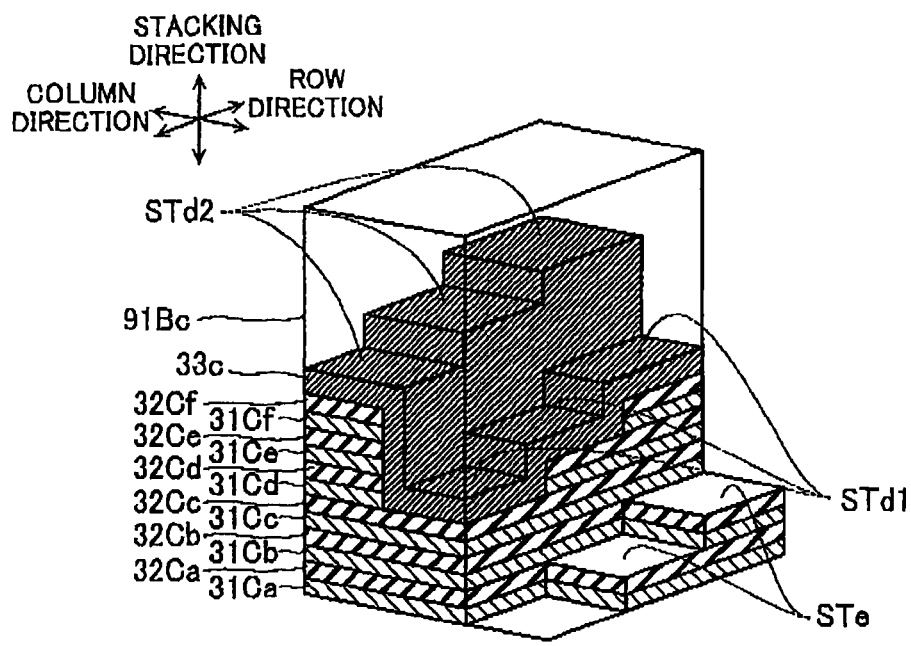

Next, as shown in FIG. 28, etching by using the resist layer 91Bc as a mask is carried out to form a step STe. The step STe is constituted by column-direction end portions of the layers 31Ca and 31Cb and layers 32Ca and 32Cb. The protecting layer 33c is divided along a boundary between the column-direction step STe and step STd1.

After this, the resist layer 91Bc is removed as shown in FIG. 22(b), and the protecting layer 33d is formed as shown in FIG. 22(a). An interlayer insulating layer is formed on the protecting layer 33d, and contact plug layers are formed to penetrate the interlayer insulating layer.

[Advantages]

The nonvolatile semiconductor memory device according to the second embodiment has a configuration similar to that of the first embodiment, and achieves advantages similar to that of the first embodiment. Furthermore, the second embodiment includes the steps STb1 to STb8 that are arranged in the matrix formation. Therefore, the second embodiment can make an area occupied by the contact plug layers smaller than in the first embodiment.

Third Embodiment

Configuration

Figure 29:
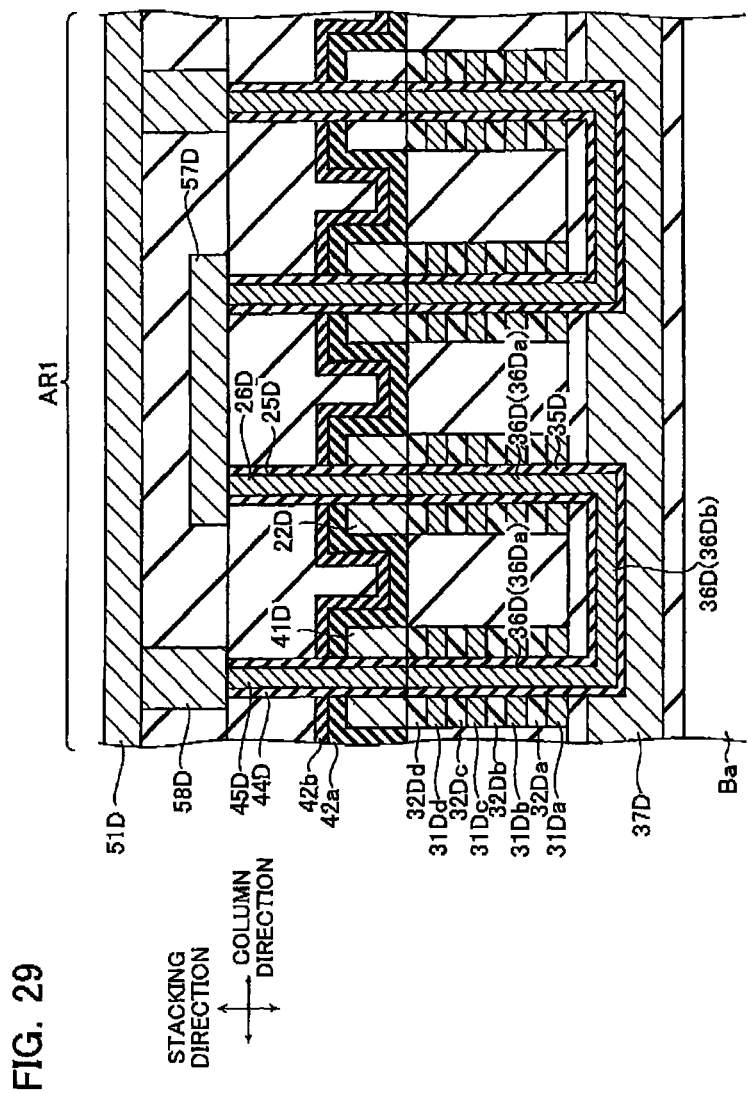
FIG. 29 is a cross section of a nonvolatile semiconductor memory device according to a third embodiment of the present invention.

Next, with reference to FIG. 29, the configuration of a nonvolatile semiconductor memory device according to the third embodiment will be explained. FIG. 29 is a cross section showing the nonvolatile semiconductor memory device according to the third embodiment. Any components of the third embodiment that are the same as those of the first embodiment will be denoted by the same reference numerals and not be explained repeatedly.

In the first embodiment, the memory columnar semiconductor layer 36 is formed in the shape of a letter "I" that extends in the stacking direction when seen in the row direction. As compared with this, a memory columnar semiconductor layer 36D according to the third embodiment is formed in the shape of a letter "U" when seen in the row direction, as shown in FIG. 29. That is, the memory columnar semiconductor layer 36D has a pair of columnar portions 36Da that extend in the stacking direction and a joining portion 36Db that joins the bottom ends of the pair of columnar portions 36Da. Word line conductive layers 31Da to 31Dd and insulating layers 32Da to 32Dd are formed as stripes that extend in the row direction with a predetermined pitch between them in the column direction, and are formed to surround the columnar portions 36Da via a memory gate insulating layer 35D.

Further, the third embodiment includes a back gate conductive layer 37D that is formed to surround the joining portion 36Db via the memory gate insulating layer 35D. The back gate conductive layer 37D is made of polysilicon.

In the third embodiment, a source-side columnar semiconductor layer 26D is formed to extend in the stacking direction from a top surface of one of the pair of columnar portions 36Da, and a drain-side columnar semiconductor layer 45D is formed to extend in the stacking direction from a top surface of the other columnar portion 36Da. A source-side conductive layer 22D and a drain-side conductive layer 41D are formed as stripes that extend in the row direction with a predetermined pitch between them in the column direction. The source-side conductive layer 22D is formed to surround the source-side columnar semiconductor layer 26D via a source-side gate insulating layer 25D, and the drain-side conductive layer 41D is formed to surround the drain-side columnar semiconductor layer 45D via a drain-side gate insulating layer 44D.

A top surface of the source-side columnar semiconductor layer 260 is connected to a third wiring layer 57D. The third wiring layer 57D functions as a source line SL. A top surface of the drain-side columnar semiconductor layer 45D is connected to a first wiring layer 51D (bit line BL) via a plug layer 58D.

Though not so shown, in the third embodiment, similarly to the first embodiment, the word line conductive layers 31Da to 31Dd and the insulating layers 32Da to 32Dd constitute a stairway portion ST (steps ST1 to ST4) at their row-direction ends. Similarly to the first embodiment, the source-side conductive layer 22D and the drain-side conductive layer 41D constitute a step ST5 at their row-direction end. Similarly to the first embodiment, the protecting layers 33a, 33b, 42a, and 42b are formed on the steps ST1 to ST5.

[Advantages]

The nonvolatile semiconductor memory device according to the third embodiment has a configuration similar to that of the first embodiment, and achieves advantages similar to that of the first embodiment.

Other Embodiments

Though embodiments of the nonvolatile semiconductor memory device having been explained, the present invention is not limited to these embodiments, but various modifications, additions, substitutions, etc. may be made thereonto within the scope of the spirit of the invention.

Figure 30:
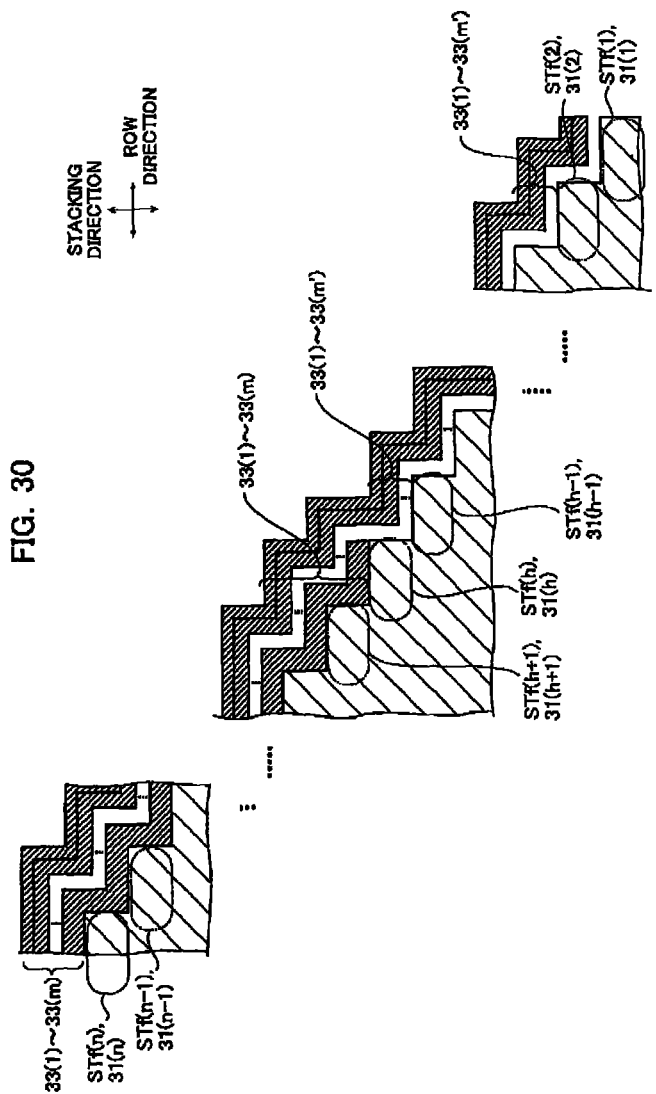
FIG. 30 is across section of a nonvolatile semiconductor memory device according to another embodiment of the present invention.

For example, in the above-described first to third embodiments, there are only two layers provided as protecting layers that cover the stairway portion. The present invention is not limited to this. As shown in FIG. 30, the nonvolatile semiconductor memory device according to the present invention may include n word line conductive layers 31(1) to 31(n) (where n is a natural number equal to or greater than 2) and m protecting layers 33(1) to 33(m) (where m is a natural number equal to or greater than 2). That is, a stairway portion STf may include n steps STf(1) to STf(n).

In the above configuration, steps STf(h) to STf(n), which are the h-th or higher-order steps as counted from the bottom (where h is a natural number equal to or greater than 2 and equal to or smaller than n), have their top surface covered with the m protecting layers 33(1) to 33(m). Steps STf(1) to STf(h−1), which are the (h−1) th or lower-order steps as counted from the bottom, have their top surface covered with m' protecting layers 33(1) to 33(m') (where m' is a natural number smaller than m).

A process of manufacturing the configuration shown in FIG. 30 will be as follows. First, n conductive layers (word line conductive layers 31(1) to 31(n)) are stacked. Then, memory holes 34 are formed to penetrate the conductive layers, and a memory gate insulating layer 35 and a memory columnar semiconductor layer 36 are formed in the memory holes 34. Then, the topmost conductive layer and the (n-h+1) th or higher-order layers as counted downward from the topmost conductive layer are processed such that their ends are located at different positions, thereby forming a first stairway portion. Then, the protecting layers 33(1) to 33(m') are formed to cover the first stairway portion. Next, the protecting layers 33(1) to 33(m') are divided, and the conductive layers under the (n-h+1)th layer counted downward from the topmost layer are processed such that the ends of the plurality of conductive layers are located at different positions, thereby forming a second stairway portion. Then, the protecting layers 33(m-m') to 33(m) are formed to cover the protecting layers and the second stairway portion.

Figure 31:
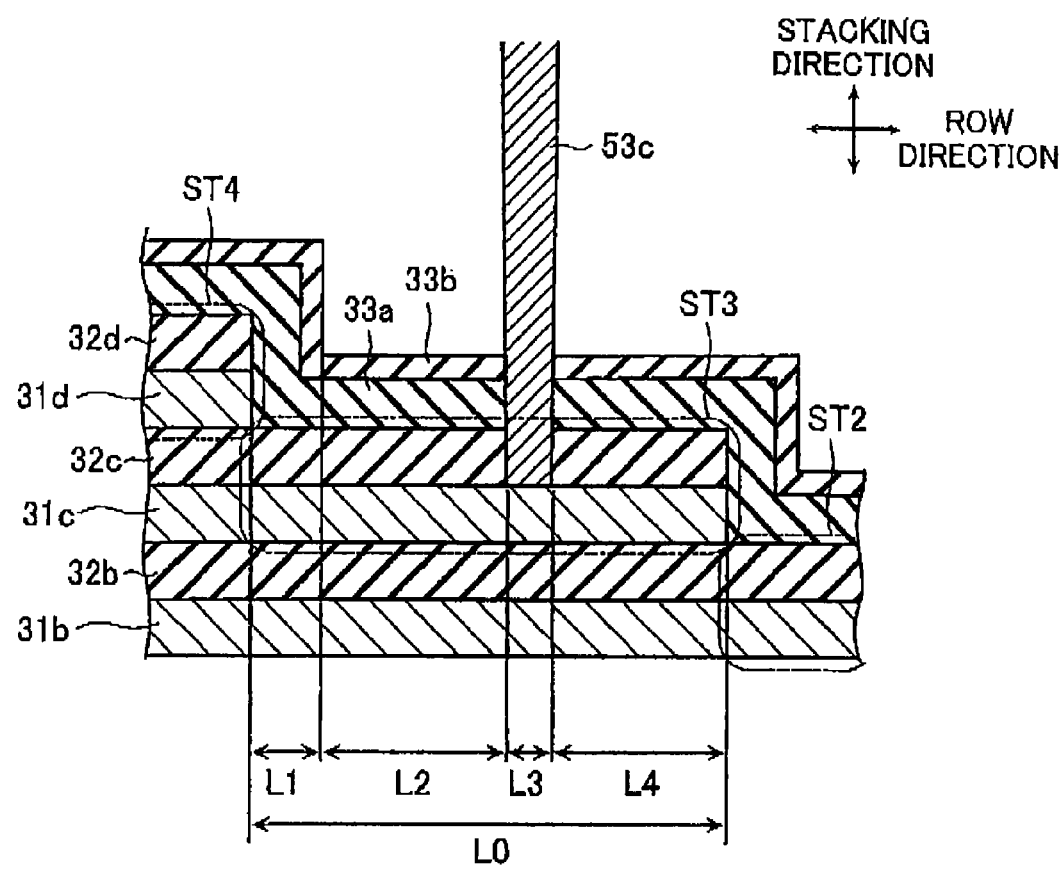
FIG. 31 is a diagram showing a row-direction length L0 of a step ST3 of the first embodiment.

Here, for example, the row-direction length L0 of the step ST3 of the first embodiment is determined by lengths L1 to L4 as shown in FIG. 31. The length L1 corresponds to the total thickness of the two protecting layers 33a and 33b on the side surface of the step ST4. The length L2 is the length from the protecting layer 33b on the side surface of the step ST4 to the side surface of the contact plug layer 53c. The length L2 is necessary in order for the contact plug layer 53c not to contact the protecting layers 33a and 33b. The length L3 corresponds to the diameter of the bottom end of the contact plug layer 53c. The length L4 is the length from the side surface of the contact plug layer 53c to the end of the step ST3. The length L4 is necessary in order for the contact plug layer 53c not to fall down to the step ST2. The length L4 needs to be defined in consideration of the variation of the end position of the step ST3 in the manufacturing process.

In the above-described embodiments, all of the protecting layers 33a and 33b, the protecting layers 42a and 42b, and the protecting layers 33c and 33d are made of silicon nitride. However, in the present invention, the protecting layers 33a, 42a and 33c may be made of silicon nitride and the protecting layers 33b, 42b, and 33d may be made of alumina. Since alumina has a higher protection performance than silicon nitride, the total film thickness of the protecting layer 33a made of silicon nitride and the protecting layer 33b made of alumina can be smaller than the total film thickness of the protecting layer 33a made of silicon nitride and the protecting layer 33b made of silicon nitride. That is, in the above-described modified example, the length L1 shown in FIG. 31 can be made shorter. Accordingly, the length L0 of the step can be made shorter, and hence the area occupied by the nonvolatile semiconductor memory device can be made smaller.

Furthermore, in the present invention, the protecting layers 33a, 42a, and 33c may be made of alumina and the protecting layers 33b, 42b, and 33d may be made of silicon nitride.

What is claimed is:

1. A nonvolatile semiconductor memory device, comprising a plurality of memory strings including a plurality of memory transistors connected in series, the memory transistors being electrically rewritable, the memory strings including:

a first semiconductor layer including a columnar portion extending in a perpendicular direction relative to a substrate, the first semiconductor layer being configured to function as a body of the memory transistors;

a charge storing layer formed to surround a side surface of the columnar portion and configured to store a charge;

a plurality of first conductive layers formed to surround the side surface of the columnar portion and the charge storing layer and configured to function as gates of the memory transistors; and a first protecting layer stacked to protect a top portion of the plurality of first conductive layers, the plurality of first conductive layers constituting a first stairway portion formed stepwise such that ends of the first conductive layers are located at different positions, each of the first conductive layers constituting a step of the first stairway portion, a top surface of a first portion of the first stairway portion being covered with the first protecting layer including a first number of layers, and a top surface of a second portion of the first stairway portion being covered with the first protecting layer including a second number of layers fewer than the first number of layers, the second portion being located at a lower level than the first portion.

2. The nonvolatile semiconductor memory device according to claim 1, wherein a plurality of the first protecting layers are made of a same material.

3. The nonvolatile semiconductor memory device according to claim 1, wherein a plurality of the first protecting layers include a layer made of silicon nitride and a layer made of alumina.

4. The nonvolatile semiconductor memory device according to claim 1, wherein the plurality of steps are arranged side by side in one line in a predetermined direction parallel with the substrate.

5. The nonvolatile semiconductor memory device according to claim 1, wherein the plurality of steps are arranged in a matrix formation in a first direction and a second direction that are parallel with the substrate, a plurality of the steps that are located at a first position in the first direction and arranged along the second direction have top surfaces covered with the first protecting layer including the first number of layers, and a plurality of the steps that are located at a second position in the first direction and arranged along in the second direction have top surfaces covered with the first protecting layer including the second number of layers, the second position adjoining the first position.

6. The nonvolatile semiconductor memory device according to claim 1, further comprising a first selector transistor connected to one end of the memory strings, wherein the first selector transistor includes:

a second semiconductor layer extending in the perpendicular direction from a top surface of the columnar portion and configured to function as a body of the first selector transistor;

a first gate insulating layer formed to surround a side surface of the second semiconductor layer; and a second conductive layer formed to surround a side surface of the first gate insulating layer and configured to function as a gate of the first selector transistor.

7. The nonvolatile semiconductor memory device according to claim 6, wherein the second conductive layer has an end located at a position different from the positions of the ends of the first conductive layers, to constitute a step succeeding the first stairway portion.

8. The nonvolatile semiconductor memory device according to claim 6, wherein the first protecting layer is formed to cover the second conductive layer.

9. The nonvolatile semiconductor memory device according to claim 6, further comprising a second selector transistor connected to the other end of the memory strings, wherein the second selector transistor includes:

a third semiconductor layer extending in the perpendicular direction from a bottom surface of the columnar portion and configured to function as a body of the second selector transistor;

a second gate insulating layer formed to surround a side surface of the third semiconductor layer; and a third conductive layer formed to surround a side surface of the second gate insulating layer and configured to function as a gate of the second selector transistor.

10. The nonvolatile semiconductor memory device according to claim 1, wherein the semiconductor layer includes a joining portion joining bottom ends of a pair of the columnar portions.

11. The nonvolatile semiconductor memory device according to claim 10, further comprising:

a first selector transistor connected to one end of the memory strings; and a second selector transistor connected to the other end of the memory strings, wherein the first selector transistor includes:

a second semiconductor layer extending in the perpendicular direction from a top surface of one of the pair of columnar portions and configured to function as a body of the first selector transistor;

a first gate insulating layer formed to surround a side surface of the second semiconductor layer; and a second conductive layer formed to surround a side surface of the first gate insulating layer and configured to function as a gate of the first selector transistor, and wherein the second selector transistor includes:

a third semiconductor layer extending in the perpendicular direction from a top surface of the other of the pair of columnar portions and configured to function as a body of the second selector transistor;

a second gate insulating layer formed to surround a side surface of the third semiconductor layer; and a third conductive layer formed to surround a side surface of the second gate insulating layer and configured to function as a gate of the second selector transistor.

12. The nonvolatile semiconductor memory device according to claim 11, wherein the second conductive layer and the third conductive layer have respective ends located at a position different from the positions of the ends of the first conductive layers, to form a step succeeding the first stairway portion.

13. The nonvolatile semiconductor memory device according to claim 11, wherein the first protecting layer is formed to cover the second conductive layer and the third conductive layer.

14. The nonvolatile semiconductor memory device according to claim 1, further comprising a control circuit configured to control the memory strings, wherein the control circuit includes:

a plurality of fourth conductive layers formed in same layers as the plurality of first conductive layers; and a second protecting layer stacked to protect a top portion of the plurality of fourth conductive layers.

15. The nonvolatile semiconductor memory device according to claim 14, wherein the control circuit further includes:

a diffused layer provided on the substrate and configured to function as a source/drain of a transistor;

a contact plug layer extending in the perpendicular direction from the diffused layer; and an interlayer insulating layer surrounding the contact plug layer, wherein the plurality of fourth conductive layers surround the interlayer insulating layer.

16. The nonvolatile semiconductor memory device according to claim 14, wherein the plurality of fourth conductive layers constitute a second stairway portion formed stepwise such that ends of the fourth conductive layers are located at different positions.

17. The nonvolatile semiconductor memory device according to claim 16, wherein a top surface of a first portion of the second stairway portion is covered with the second protecting layer including a first number of layers, and a top surface of a second portion of the second stairway portion is covered with the second protecting layer including a second number of layers fewer than the first number of layers, the second portion being located at a lower level than the first portion.

* * * * *